US010403363B2

(12) United States Patent
Jung

(10) Patent No.: US 10,403,363 B2
(45) Date of Patent: Sep. 3, 2019

(54) NONVOLATILE MEMORY AND STORAGE DEVICE INCLUDING NONVOLATILE MEMORY

(71) Applicant: SAMSUNG ELECTRONICS CO., LTD., Suwon-si, Gyeonggi-Do (KR)

(72) Inventor: Won-Taeck Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/957,676

(22) Filed: Apr. 19, 2018

(65) Prior Publication Data

US 2018/0240522 A1    Aug. 23, 2018

Related U.S. Application Data

(63) Continuation-in-part of application No. 14/994,173, filed on Jan. 13, 2016, now Pat. No. 9,978,454.

(30) Foreign Application Priority Data

Feb. 11, 2015    (KR) .................. 10-2015-0021025

(51) Int. Cl.
  *G06F 3/06*      (2006.01)
  *G11C 8/08*     (2006.01)
        (Continued)

(52) U.S. Cl.
  CPC .............. *G11C 16/08* (2013.01); *G06F 3/064* (2013.01); *G06F 3/0619* (2013.01);
        (Continued)

(58) Field of Classification Search
  CPC ... G11C 8/08; G11C 11/5671; G11C 16/0483; G11C 16/08; G11C 16/30;
        (Continued)

(56) References Cited

U.S. PATENT DOCUMENTS 6,731,540 B2    5/2004    Lee et al.
7,095,653 B2    8/2006    Abedifard
        (Continued)

FOREIGN PATENT DOCUMENTS

JP      2008-310900 A    12/2008

*Primary Examiner* — Harry W Byrne
*Assistant Examiner* — R Lance Reidlinger
(74) *Attorney, Agent, or Firm* — Volentine, Whitt & Francos, PLLC

(57) ABSTRACT

A nonvolatile memory includes a plurality of memory blocks, a plurality of source drivers corresponding to the plurality of memory blocks, a plurality of pass transistor groups connected between the plurality of source drivers and the plurality of memory blocks, a plurality of block pass transistors connected between a plurality of block word lines and the plurality of pass transistor groups, a plurality of block decoders corresponding to a plurality of memory block groups respectively, and a block pass transistor decoder configured to control voltages of block select lines connected to the plurality of block pass transistors. The plurality of memory blocks are divided into the plurality of memory block groups. Each block decoder is configured to control voltages of block word lines, among the plurality of block word lines, connected to at least two memory blocks of a corresponding memory block group in common.

20 Claims, 13 Drawing Sheets

(51) Int. Cl.
*G11C 16/08* (2006.01)
*G11C 16/30* (2006.01)
*G11C 11/56* (2006.01)
*G11C 16/04* (2006.01)
*G11C 16/34* (2006.01)
*H01L 27/1157* (2017.01)
*H01L 27/11582* (2017.01)

(52) U.S. Cl.
CPC .......... *G06F 3/0659* (2013.01); *G06F 3/0679* (2013.01); *G11C 8/08* (2013.01); *G11C 16/30* (2013.01); *G11C 11/5671* (2013.01); *G11C 16/0483* (2013.01); *G11C 16/3427* (2013.01); *G11C 16/3436* (2013.01); *H01L 27/1157* (2013.01); *H01L 27/11582* (2013.01)

(58) Field of Classification Search
CPC ............ G11C 16/3427; G11C 16/3436; G06F 3/0619; G06F 3/064; G06F 3/0659; G06F 3/0679; H01L 27/1157; H01L 27/11582
See application file for complete search history.

(56) References Cited

U.S. PATENT DOCUMENTS

| | | |
|---|---|---|
| 7,170,780 B2 | 1/2007 | Kawai |
| 7,206,228 B2 | 4/2007 | Park |
| 7,679,133 B2 | 3/2010 | Son et al. |
| 7,821,832 B2 | 10/2010 | Hahn |
| 8,027,208 B2 | 9/2011 | Kim |
| 8,553,466 B2 | 10/2013 | Han et al. |
| 8,559,235 B2 | 10/2013 | Yoon et al. |
| 8,654,587 B2 | 2/2014 | Yoon et al. |
| 8,675,407 B2 | 3/2014 | Namai |
| 8,693,248 B2 | 4/2014 | Kwon |
| 8,760,925 B2 | 6/2014 | Li |
| 8,837,228 B2 | 9/2014 | Nam et al. |
| 2010/0124128 A1 | 5/2010 | Nagao et al. |
| 2011/0233648 A1 | 9/2011 | Seol et al. |
| 2012/0268992 A1 | 10/2012 | Kim et al. |
| 2013/0215702 A1 | 8/2013 | Chu |
| 2016/0232973 A1* | 8/2016 | Jung ..................... G11C 16/08 |

* cited by examiner

NONVOLATILE MEMORY AND STORAGE DEVICE INCLUDING NONVOLATILE MEMORY

CROSS-REFERENCE TO RELATED APPLICATIONS

This U.S. non-provisional patent application is a continuation-in-part application of U.S. application Ser. No. 14/994,173 filed on Jan. 13, 2016, which claims priority under 35 U.S.C. § 119 of Korean Patent Application No. 10-2015-0021025, filed on Feb. 11, 2015, the entire contents of which are hereby incorporated by reference.

BACKGROUND

The disclosure relates to a semiconductor memory, and more particularly, to a nonvolatile memory and a storage device including the nonvolatile memory.

A storage device is a device storing data under the control of a host device such as a computer, a smart phone, a smart pad, etc. A storage device includes a device storing data in a magnetic disk such as a HDD (hard disk drive) and a device storing data in a semiconductor memory, in particular, a nonvolatile memory such as a SSD (solid state drive), a memory card, etc.

Examples of a nonvolatile memory include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), a FRAM (ferroelectric RAM), etc.

As a semiconductor manufacturing technology develops, high integration and a higher capacity of a nonvolatile memory or a storage device are continuously proceeding. A high integration of a nonvolatile memory or a storage device has an advantage of reducing its production cost. However, as a scale of a nonvolatile memory or a storage device is reduced and its structure is changed due to the high integration of the nonvolatile memory of the storage device, various problems that were not previously known are being found. The various problems being newly found may damage data stored in the nonvolatile memory or the storage device and thereby the reliability of the nonvolatile memory or the storage device may be degraded. A requirement for a method and a device that can improve reliability of the nonvolatile memory or the storage device is continuously being suggested.

SUMMARY

Embodiments of the disclosure provide a nonvolatile memory. The nonvolatile memory may include (1) a plurality of memory blocks, the plurality of memory blocks being divided into a plurality of memory block groups, each memory block group including at least two memory blocks, (2) a plurality of source drivers corresponding to the plurality of memory blocks, (3) a plurality of pass transistor groups connected between the plurality of source drivers and the plurality of memory blocks, each pass transistor group including a plurality of pass transistors, (4) a plurality of block pass transistors connected between a plurality of block word lines and the plurality of pass transistor groups, (5) a plurality of block decoders corresponding to the plurality of memory block groups respectively, each block decoder being configured to control first voltages of block word lines, among the plurality of block word lines, connected to the at least two memory blocks of a corresponding memory block group in common, and (6) a block pass transistor decoder configured to control second voltages of block select lines connected to the plurality of block pass transistors.

Embodiments of the disclosure also provide a storage device. The storage device may include a memory controller configured to output an command and an address and a nonvolatile memory comprising first through fourth memory blocks and configured to access one of the first through fourth memory blocks in response to the command and the address. The nonvolatile memory further comprises (1) a first block decoder configured to output first voltage to first and second block word lines corresponding to the first and second memory blocks, (2) a second block decoder configured to output second voltage to third and fourth block word lines corresponding to the third and fourth memory blocks, (3) a block pass transistor decoder configured to output third voltage to first and third block select lines corresponding to the first and third memory blocks and output fourth voltage to second and fourth block select lines corresponding to the second and fourth memory blocks, (4) first through fourth pass transistor groups configured to transmit word line voltages to one of the first through fourth memory blocks in response to gate voltages, and (5) first through fourth block pass transistors configured to transmit the first and second voltages to either the first and third pass transistor groups or the second and fourth pass transistor groups as the gate voltages in response to the third and fourth voltages.

Embodiments of the disclosure provide a nonvolatile memory including: (1) first through fourth memory blocks, (2) a first block decoder configured to output first voltage to first and second block word lines corresponding to the first and second memory blocks, (3) a second block decoder configured to output second voltage to third and fourth block word lines corresponding to the third and fourth memory blocks, (4) first through fourth pass transistor groups configured to transmit word line voltages to one of the first through fourth memory blocks in response to gate voltages, and (5) first through fourth block pass transistors connected between gates of the first through fourth pass transistor groups and the first and second block decoders.

BRIEF DESCRIPTION OF THE FIGURES

Preferred embodiments of the disclosure will be described below in more detail with reference to the accompanying drawings. The embodiments of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

DETAILED DESCRIPTION

Figure 1:
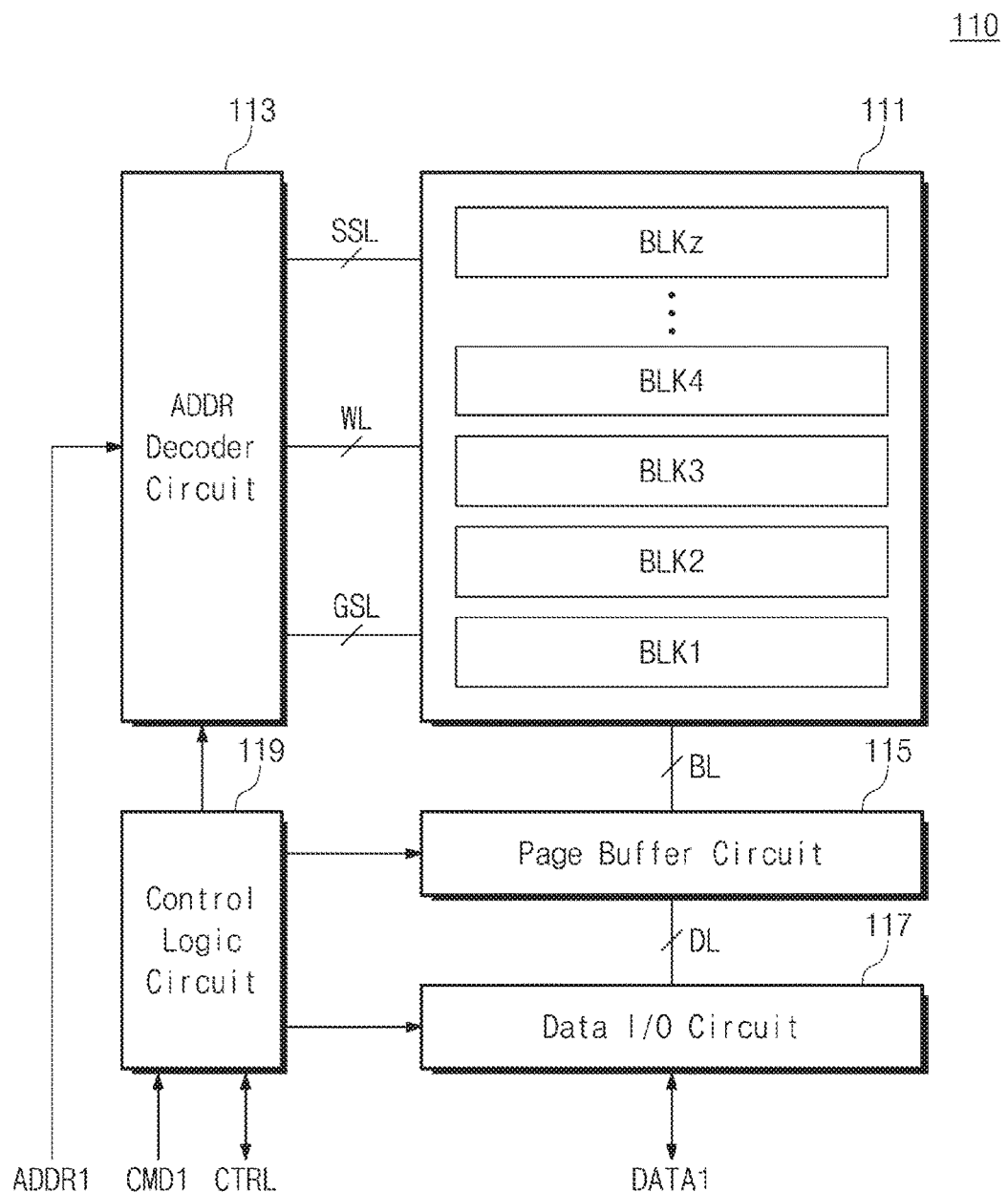
FIG. 1 is a block diagram illustrating a nonvolatile memory in accordance with exemplary embodiments of the disclosure.

Embodiments of disclosure will be described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

FIG. 1 is a block diagram illustrating a nonvolatile memory in accordance with exemplary embodiments of the disclosure. Referring to FIG. 1, a nonvolatile memory 110 includes a memory cell array 111, an address decoder circuit 113, a page buffer circuit 115, a data input/output circuit 117 and a control logic circuit 119.

The memory cell array 111 includes a plurality of memory blocks BLK1~BLKz. Each memory block may be connected to the address decoder circuit 113 through at least one ground select line GSL, a plurality of word lines WL and at least one string select line SSL. Each memory block may be connected to the page buffer circuit 115 through a plurality of bit lines BL. The memory blocks BLK1~BLKz may be connected to the bit lines BL in common. Memory cells of the memory blocks BLK1~BLKz may have the same structure. Each of the memory blocks BLK1~BLKz may be a unit of an erase operation. Memory cells of the memory cell array 111 may be erased by a memory block unit. Memory cells that belong to one memory block may be erased at the same time. Each memory block may be divided into a plurality of sub blocks. Each of the sub blocks may be a unit of an erase operation, rather than a block being a unit of the erase operation.

Figure 10:
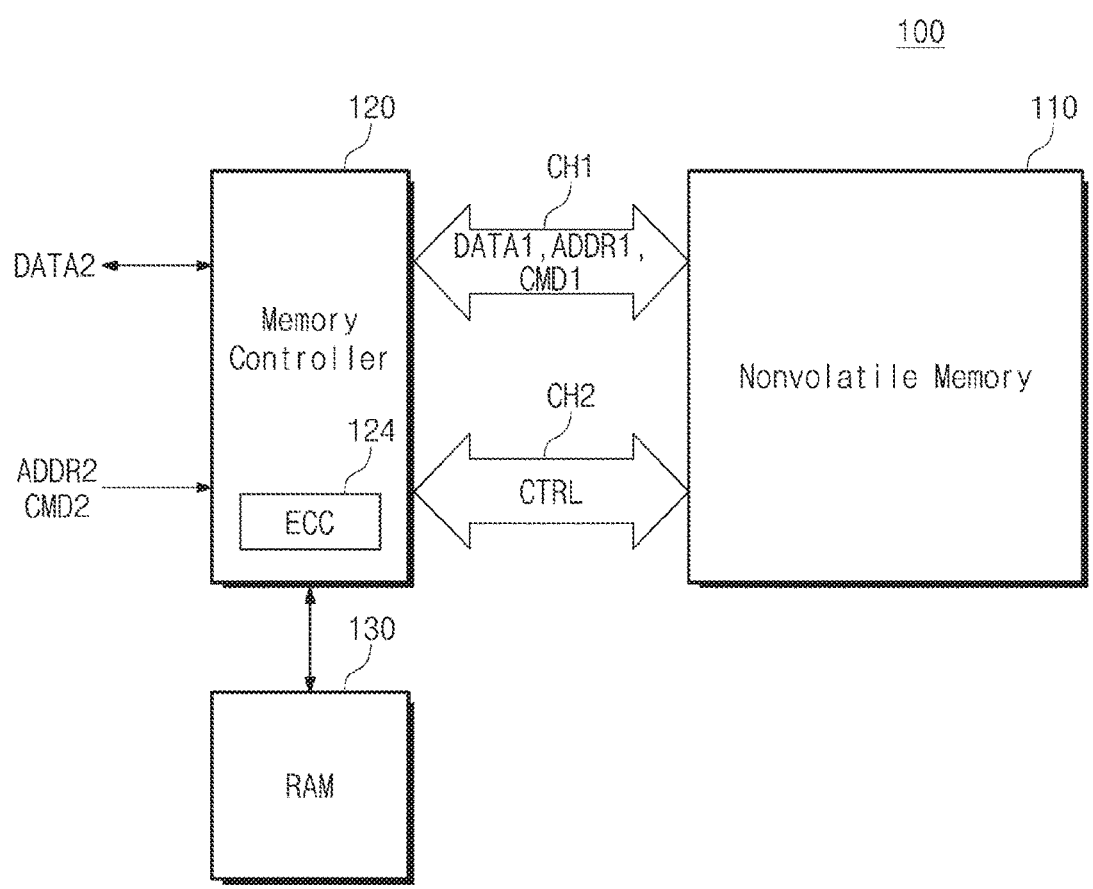
FIG. 10 is a block diagram illustrating a storage device in accordance with exemplary embodiments of the disclosure.

In an embodiment of the disclosure, the address decoder circuit 113 is connected to the memory cell array 111 through a plurality of ground select lines GSL, a plurality of word lines WL and a plurality of string select lines SSL. The address decoder circuit 113 operates under the control of the control logic circuit 119. The address decoder circuit 113 may receive a first address ADDR1 from a memory controller 120, which is illustrated in FIG. 10. The address decoder circuit 113 decodes the received first address ADDR1 and can control the voltages being applied to the word lines WL according to the decoded address.

For example, in a program operation, the address decoder circuit 113 may apply a program voltage VGPM to a selected word line of a selected memory block which the first address ADDR1 indicates and apply a pass voltage VPASS to unselected word lines of the selected memory block. In a read operation, the address decoder circuit 113 may apply a select read voltage VRD to a selected word line of a selected memory block which the first address ADDR1 indicates and apply an unselect read voltage VREAD to unselected word lines of the selected memory block. In an erase operation, the address decoder circuit 113 may apply erase voltages (for example, an erase voltage or low voltages having levels similar to the ground voltage) to word lines of a selected memory block which the first address ADDR1 indicates.

The page buffer circuit 115 is connected to the memory cell array 111 through a plurality of bit lines BL. The page buffer circuit 115 is connected to the data input/output circuit 117 through a plurality of data lines DL. The page buffer circuit 115 operates under the control of the control logic circuit 119.

The page buffer circuit 115 can store data to be programmed in memory cells of the memory cell array 111 or data being read from memory cells of the memory cell array 111. In a program operation, the page buffer circuit 115 can store data to be programmed in memory cells. The page buffer circuit 115 can bias a plurality of bit lines BL on the basis of the stored data. In a program operation, the page buffer circuit 115 can function as a write driver. In a read operation, the page buffer circuit 115 can sense voltages of bit lines BL and store a sensing result. In a read operation, the page buffer circuit 115 can function as a sense amplifier.

The data input/output circuit 117 is connected to the page buffer circuit 115 through a plurality of data lines DL. The data input/output circuit 117 can exchange first data DATA1 with the memory controller 120.

The data input/output circuit 117 can temporarily store first data DATA1 being received from the memory controller 120. The data input/output circuit 117 can transmit the stored data to the page buffer circuit 115. The data input/output circuit 117 can temporarily store data DATA being transmitted from the page buffer circuit 115. The data input/output circuit 117 can transmit the stored data to the memory controller 120. The data input/output circuit 117 can function as a buffer memory.

The control logic circuit 119 receives a first command CMD1 and a control signal CTRL from the memory controller 120. The control logic circuit 119 can decode the received first command CMD1 and control an overall operation of the nonvolatile memory 110 according to the decoded command.

In a read operation, the control logic circuit 119 can generate a data strobe signal DQS from a read enable signal /RE among the received control signal CTRL and output it. In a write operation, the control logic circuit 119 can receive a data strobe signal DQS included in the control signal CTRL.

Figure 2:
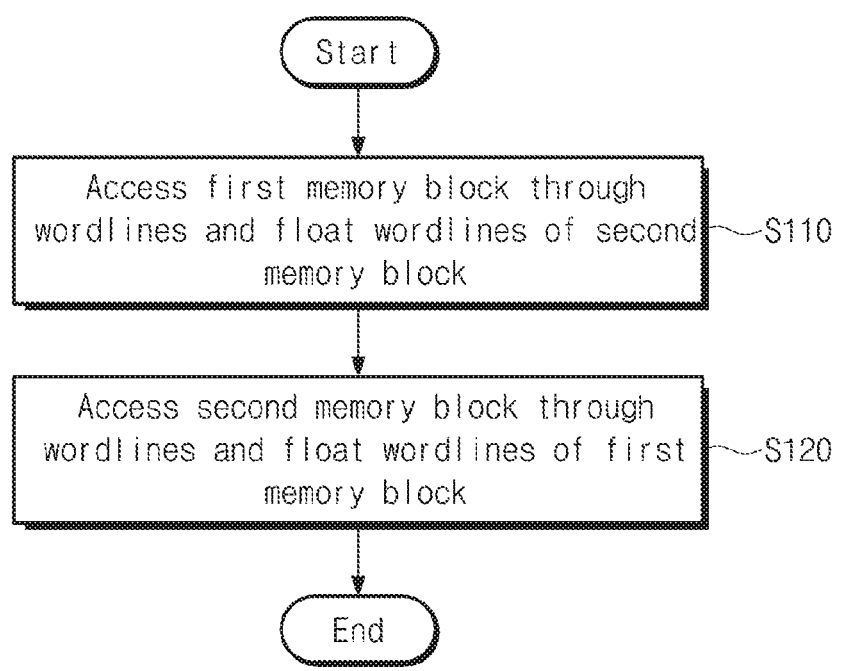
FIG. 2 is a flowchart illustrating an operation method of a nonvolatile memory in accordance with exemplary embodiments of the disclosure.

FIG. 2 is a flowchart illustrating an operation method of a nonvolatile memory 110 in accordance with exemplary embodiments of the disclosure. Referring to FIG. 2, in a step S110, the nonvolatile memory 110 can access a first memory block through word lines connected to the first memory block and float word lines connected to a second memory block. In a step S120, the nonvolatile memory 110 can access the second memory block through word lines connected to the second memory block and float word lines connected to the first memory block.

The first memory block and the second memory block described above may be memory blocks sharing a block word line. The nonvolatile memory 110 can access a selected memory block by applying a voltage through word lines connected to a selected memory block among memory blocks sharing the block word line. The nonvolatile memory 110 can float word lines connected to an unselected memory block among the memory blocks sharing the block word line.

Figure 3:
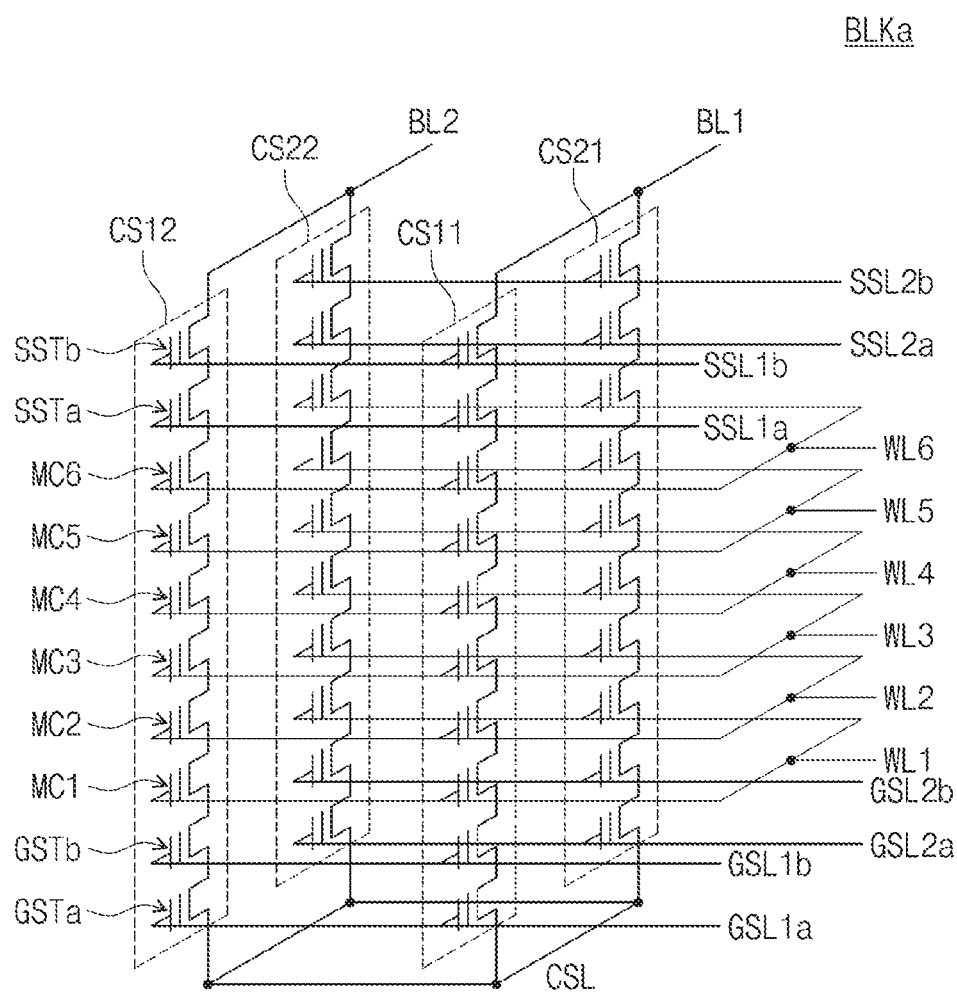
FIG. 3 is a circuit diagram illustrating a memory block in accordance with exemplary embodiments of the disclosure.
Figure 3:
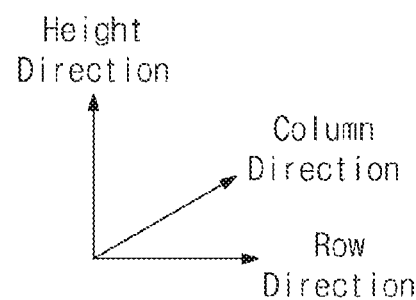

FIG. 3 is a circuit diagram illustrating a memory block BLKa in accordance with exemplary embodiments of the disclosure. Referring to FIG. 3, the memory block BLKa includes a plurality of cell strings CS11~CS21 and CS12~CS21. The cell strings CS11~CS21 and CS12~CS21 may be arranged along a row direction and a column direction to form rows and columns.

For example, the cell strings CS11 and CS12 arranged along a row direction may form a first row and the cell strings CS21 and CS22 arranged along the row direction may form a second row. The cell strings CS11 and CS21 arranged along a column direction may form a first column and the cell strings CS12 and CS22 arranged along the column direction may form a second column.

Each cell string may include a plurality of cell transistors. The cell transistors include ground select transistors GSTa and GSTb, memory cells MC1~MC6, and string select transistors SSTa and SSTb. The ground select transistors GSTa and GSTb, the memory cells MC1~MC6, and the string select transistors SSTa and SSTb of each cell string may be stacked in a direction perpendicular to a plane (for example, a plane of a substrate of the memory block BLKa) on which the cell strings CS11~CS21 and CS12~CS21 are arranged along rows and columns.

The cell transistors may be charge trap type transistors having threshold voltages that change depending on a charge amount captured by an insulating layer.

Sources of the lowermost ground select transistors GSTa may be connected to a common source line CSL in common.

Control gates of the ground select transistors GSTa of the first row cell strings CS11 and CS12 are connected to a ground select line GSL1a in common. Control gates of the ground select transistors GSTa of the second row cell strings CS21 and CS22 are connected to a ground select line GSL2a in common. Control gates of the ground select transistors GSTb of the first row cell strings CS11 and CS12 are connected to a ground select line GSL1b in common. Control gates of the ground select transistors GSTb of the second row cell strings CS21 and CS22 are connected to a ground select line GSL2b in common.

Cell strings of different rows are connected to different ground select lines. Ground select transistors of the same height (or order) of cell strings of the same row are connected to the same ground select line. Ground select transistors of the different height (or order) of cell strings of the same row are connected to different ground select lines.

The memory block BLKa may be changed so that ground select lines connected to ground select transistors of different heights of the same row are connected to one another to be controlled in common. The memory block BLKa may be changed so that ground select lines connected to ground select transistors of the same height of the different rows are connected to one another to be controlled in common. The memory block BLKa may be changed so that ground select lines connected to ground select transistors are connected to one another to be controlled in common.

Control gates of memory cells located at the same height from a substrate (or ground select transistors GST) may be connected to one word line in common and control gates of memory cells located at different heights (or order) may be connected to different word lines WL1~WL6 respectively. For example, memory cells MC1 are connected to the word line WL1 in common. Memory cells MC2 are connected to the word line WL2 in common. Memory cells MC3 are connected to the word line WL3 in common. Memory cells MC4 are connected to the word line WL4 in common. Memory cells MC5 are connected to the word line WL5 in common. Memory cells MC6 are connected to the word line WL6 in common.

At the first string select transistors SSTa of the same height (or order) of the cell strings CS11~CS21 and CS12~CS21, control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At the second string select transistors SSTb of the same height (or order) of the cell strings CS11~CS21 and CS12~CS21, control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or order) of cell strings of the same row are connected to different string select lines.

String select transistors of cell strings of the same row may be connected to one string select line in common. For example, the string select transistors SSTa and SSTb of the first row cell strings CS11 and CS12 may be connected to one string select line in common. The string select transistors SSTa and SSTb of the second row cell strings CS21 and CS22 may be connected to one string select line in common.

Columns of the cell strings CS11~CS21 and CS12~CS22 are connected to different bit lines BL1 and BL2 respectively. For example, the string select transistors SST of the first column cell strings CS11~CS21 are connected to the bit line BL1 in common. The string select transistors SST of the second column cell strings CS12~CS22 are connected to the bit line BL2 in common.

The cell strings CS11 and CS12 may form a first plane. The cell strings CS21 and CS22 may form a second plane.

In the memory block BLKa, memory cells of each height of each plane may form a physical page. The physical page may be a write unit and a read unit of the memory cells MC1~MC6. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected. In the selected plane, one row of the memory cells MC is selected by the word lines WL1~WL6. In the selected row, a select voltage is applied to the second word line WL2 and an unselect voltage may be applied to the remaining word lines WL1 and WL3~WL6. That is, a physical page corresponding to the second word line WL2 of the second plane may be selected by controlling voltages of the string select lines SSL1a, SSL1b, SSL2a and SSL2b and the word lines WL1~WL6. In the memory cells MC2 of the selected physical page, a write or read operation may be performed.

At least two bits may be written in each of the memory cells MC. Bits being written in each of memory cells MC that belong to one physical page form logical pages. A first bit being written in each of memory cells MC that belong to one physical page forms a first logical page. An Nth bit being written in each of memory cells MC that belong to one physical page forms an Nth logical page. The logical page may be a data access unit. When a read operation is performed in one physical page, data may be accessed by a logical page unit.

In the memory block BLKa, an erase of the memory cells MC1~MC6 may be performed by a memory block unit or a sub block unit. When an erase operation is performed by a memory block unit, the memory cells MC of the memory block BLKa may be all erased at the same time according to one erase request (for example, an erase request from an external memory controller). When an erase operation is performed by a sub block unit, parts of the memory cells MC1~MC6 may be erased at the same time according to one erase request (for example, an erase request from an external memory controller) and the remaining parts of the memory cells MC1~MC6 may be erase-prohibited. A low voltage (for example, a ground voltage or a low voltage having a similar level to the ground voltage) is supplied to a word line connected to memory cells MC being erased and a word line connected to erase-prohibited memory cells MC may be floated.

The memory block BLKa illustrated in FIG. 3 is illustrative. A technical spirit of the disclosure is not limited to the memory block BLKa illustrated in FIG. 3. For example, the number of rows of cell strings may increase or decrease. As the number of rows of cell strings is changed, the number of string select lines or ground select lines connected to the rows of the cell strings and the number of cell strings connected to one bit line may also be changed.

The number of columns of cell strings may increase or decrease. As the number of columns of cell strings is changed, the number of bit lines connected to the columns of the cell strings and the number of cell strings connected to one string select line may also be changed.

Heights of cell strings may increase or decrease. For example, the number of ground select transistors, memory cells or string select transistors that are stacked on each cell string may increase or decrease.

Memory cells MC that belong to one physical page can correspond to at least three logical pages. For example, k (k is an integer greater than 2) number of bits can be programmed in one memory cell MC. In memory cells MC that belong to one physical page, k number of bits being programmed in each memory cell MC can form k number of logical pages respectively.

As described above, the memory block BLKa may be provided as a three-dimensional memory array. The three-dimensional memory array may be monolithically formed on at least one physical level of memory cells MC having an active area being disposed on a silicon substrate and a circuit involved with an operation of memory cells MC. The circuit involved with an operation of memory cells MC may be disposed in or on the substrate. That the three-dimensional memory array is monolithically formed means that layers of each level of the three-dimensional array is directly deposited on layers of a lower level of the three-dimensional memory array.

The three-dimensional memory array has a vertical directivity and thereby includes vertical NAND strings (or cell strings) in which at least one memory cell is located on another memory cell. The at least one memory cell MC includes a charge capture layer. Each vertical NAND string further includes at least one select transistor located on the memory cells MC. The at least one select transistor has the same structure as the memory cells MC and is monolithically formed together with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 4:
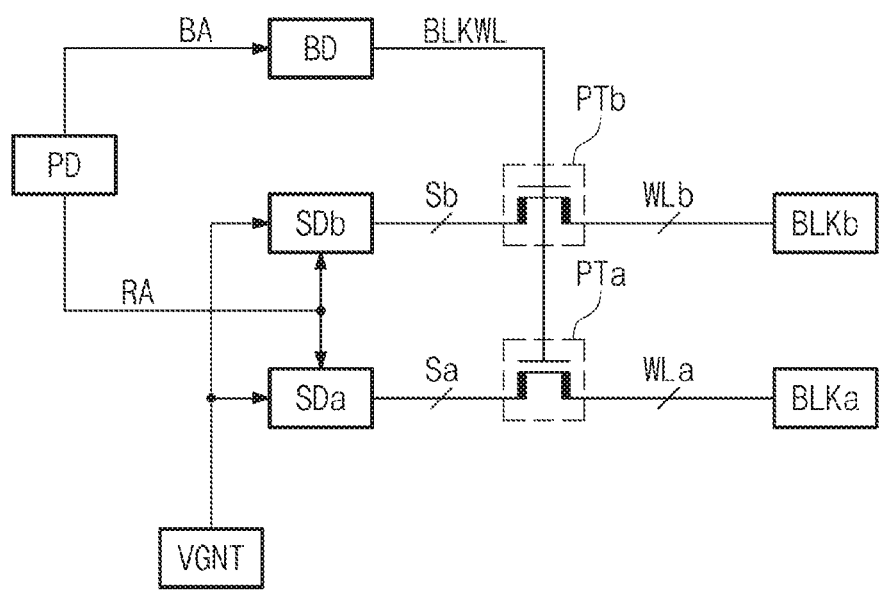
FIG. 4 is a block diagram illustrating memory blocks and peripheral circuits in accordance with a first embodiment of the disclosure.

FIG. 4 is a block diagram illustrating memory blocks and peripheral circuits in accordance with a first embodiment of the disclosure. Referring to FIGS. 3 and 4, the memory block BLKa is connected to a pass transistor unit PTa through word lines WLa. The word lines WLa may include the word lines WL1~WL6 described with reference to FIG. 3. The pass transistor unit PTa may include a plurality of pass transistors and the word lines WL1~WL6 may be connected to different pass transistors respectively. The string select lines SSL1a, SSL1b, SSL2a and SSL2b and the ground select lines GSL1a, GSL1b, GSL2a and GSL2b may also be connected to different pass transistors of the pass transistor unit PTa respectively.

The memory block BLKb is connected to a pass transistor unit PTb through word lines WLb. The word lines WLb may include the word lines WL1~WL6 described with reference to FIG. 3. The pass transistor unit PTb may include a plurality of pass transistors and the word lines WL1~WL6 may be connected to different pass transistors respectively. The string select lines SSL1a, SSL1b, SSL2a and SSL2b and the ground select lines GSL1a, GSL1b, GSL2a and GSL2b may also be connected to different pass transistors of the pass transistor unit PTb respectively.

The pass transistors of the pass transistor unit PTa and the pass transistor unit PTb may include high voltage transistors.

A source driver SDa is connected to the pass transistor unit PTa through source lines Sa. The source lines Sa may be connected to the word lines WL1~WL6, the string select lines SSL1a, SSL1b, SSL2a and SSL2b and the ground select lines GSL1a, GSL1b, GSL2a and GSL2b respectively of the memory block BLKa through the pass transistors of the pass transistor unit PTa. The source driver SDa can transmit voltages being supplied from a voltage generator VGNT to the source lines Sa in response to a row address RA.

A source driver SDb is connected to the pass transistor unit PTb through source lines Sb. The source lines Sb may be connected to the word lines WL1~WL6, the string select lines SSL1a, SSL1b, SSL2a and SSL2b and the ground select lines GSL1a, GSL1b, GSL2a and GSL2b respectively of the memory block BLKb through the pass transistors of the pass transistor unit PTb. The source driver SDb can transmit voltages being supplied from a voltage generator VGNT to the source lines Sb in response to a row address RA.

A block decoder BD is configured to control the pass transistor unit PTa and the pass transistor unit PTb through a block word line BLKWL in response to a block address BA. The block word line BLKWL may be connected to gates of the pass transistors of the pass transistor unit PTa and the pass transistor unit PTb in common. That is, the memory blocks BLKa and BLKb may share the block word line BLKWL.

A predecoder PD can extract the block address BA and the row address RA from the first address ADDR1.

The voltage generator VGNT can generate various voltages being used in the nonvolatile memory 110.

The memory blocks BLKa and BLKb may be included in the memory cell array 111. The pass transistor unit PTa, the pass transistor unit PTb, the source driver SDa, the source driver SDb, the block decoder BD, and the predecoder PD may be included in the address decoder 113. The voltage generator VGNT may be included in the control logic 119.

Figure 5:
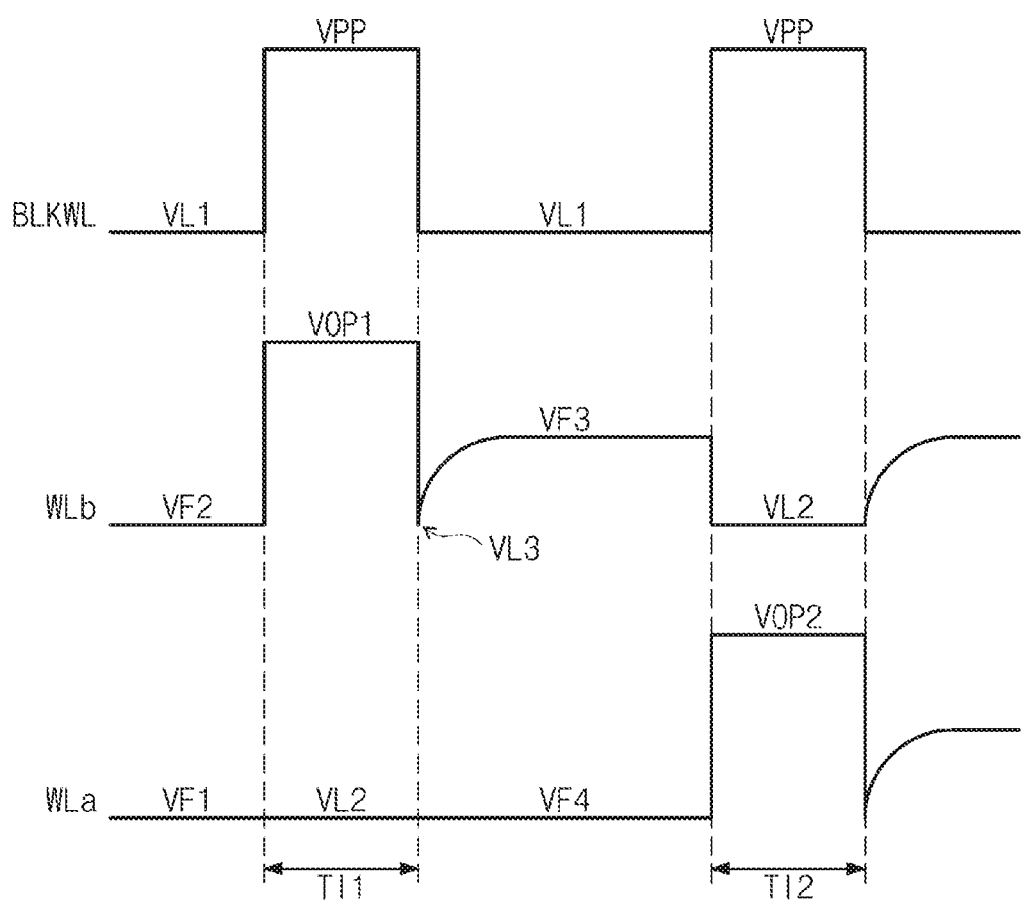
FIG. 5 illustrates an example of an exchange of voltages of a nonvolatile memory when the nonvolatile memory accesses one of memory blocks.

When the nonvolatile memory 110 accesses one of the memory blocks BLKa and BLKb, an example of a change of voltages of the nonvolatile memory 110 is illustrated in FIG. 5. A change of voltages of the word lines WLa and WLb is illustrated in FIG. 5. However, a technical spirit of the disclosure is not limited to a change of voltages of the word lines WLa and WLb.

Referring to FIGS. 4 and 5, in a first period TI1, the nonvolatile memory 110 can access the memory block BLKb. For example, when the first address ADDR1 indicates the memory block BLKb and the first command CMD1 indicates a program, read or erase operation, the nonvolatile memory 110 can access the memory block BLKb.

During the first period TI1, the nonvolatile memory 110 can activate the block word line BLKWL corresponding to the memory block BLKb corresponding to the first address ADDR1. For example, the block decoder BD can apply a high voltage VPP to the block word line BLKWL so that the pass transistors of the pass transistor unit PTa and the pass transistor unit PTb are all turned on. A voltage of the block word line BLKWL is changed from a low voltage VL1, for example, a ground voltage VSS to the high voltage VPP. If the block word line BLKWL is activated, the source lines Sa of the source driver SDa are electrically connected to the word lines WLa of the memory block BLKa. The source lines Sb of the source driver SDb are electrically connected to the word lines WLb of the memory block BLKb.

The source driver SDa connected to the memory block BLKa sharing the block word line BLKWL with the memory block BLKb selected by the first address ADDR1 can apply a low voltage VL2, for example, a ground voltage VSS to the source lines Sa. Voltages of the word lines WLa of an unselected memory block BLKa are changed from floating voltages VF1 to the low voltages VL2.

The source driver SDb connected to the memory block BLKb selected by the first address ADDR1 can apply operating voltages VOP1 to the source lines Sb. The operating voltages VOP1 may include voltages being used in a program, read or erase operation. Voltages of the word line WLb of the selected memory block BLKb are changed from floating voltages VF2 to the operating voltage VOP1.

After an access of the selected memory block BLKb is completed, the source driver SDb reduces voltages of the source lines Sb, that is, voltages of the word lines WLb to a low voltage VL3. At this time, voltages of channels of the memory cells MC1~MC6 of the selected memory block BLKb may be reduced to negative potential. For example, as voltages of the word lines WLb are reduced, the memory cells MC may be turned off. Channels of the turned-off memory cells MC may be in a floating state. As voltages of the word lines WLb are reduced to the low voltage VL3, a voltage of the floated channel may be lowered to a negative potential by a capacitive coupling.

If the first period TI1 is finished, the block decoder BD applies a low voltage VL1 to the block word line BLKWL. The source drivers SDa and SDb are electrically separated from the memory blocks BLKa and BLKb. That is, the word lines WLa and WLb are floated.

As time goes by, a potential of the floated channels of the memory cells MC of the memory block BLKb may be recovered from a negative potential to a ground level. As a potential of the floated channels increases, voltages of the word lines WLb of floating state may increase to floating voltages VF3 due to a coupling phenomenon.

During a second period TI2, the nonvolatile memory 110 can activate the block word line BLKWL corresponding to the memory block BLKa corresponding to the first address ADDR1. The source lines Sa and Sb of the source drivers SDa and SDb are electrically connected to the word lines WLa and WLb of the memory blocks BLKa and BLKb.

The source driver SDb connected to the memory block BLKb sharing the block word line BLKWL with the memory block BLKa selected by the first address ADDR1 can apply a low voltage VL2, for example, a ground voltage VSS to the source lines Sb. Voltages of the word lines WLb of an unselected memory block BLKb are changed from floating voltages VF3 to the low voltages VL2.

The source driver SDa connected to the memory block BLKa selected by the first address ADDR1 can apply operating voltages VOP2 to the source lines Sa. The operating voltages VOP2 may include voltages being used in a program, read or erase operation. Voltages of the word line WLa of the selected memory block BLKa are changed from floating voltages VF4 to the operating voltage VOP2.

In the second period TI2, the nonvolatile memory 110 can access the memory block BLKa. For example, when the first address ADDR1 indicates the memory block BLKa and the first command CMD1 indicates a program, read or erase operation, the nonvolatile memory 110 can access the memory block BLKa.

In the second period TI2, the low voltages VL2 are applied to the word lines WLb of the unselected memory block BLKb. An electric field may occur in the unselected memory block BLKb due to the low voltages VL2 being applied to the word lines WLb, and thus threshold voltages of the memory cells MC of the unselected memory block BLKb may be disturbed due to the occurred electric field. That is, reliability of data to be programmed in the memory cells MC of the unselected memory block BLKb may be degraded.

Figure 6:
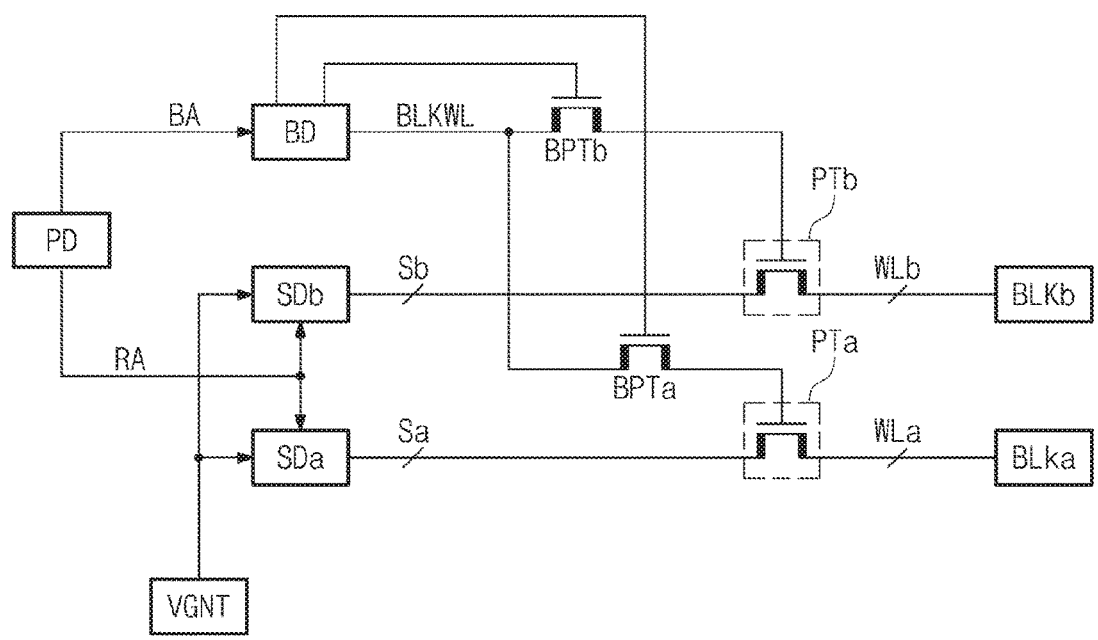
FIG. 6 is a block diagram illustrating memory blocks and peripheral circuits in accordance with a second embodiment of the disclosure.

FIG. 6 is a block diagram illustrating memory blocks and peripheral circuits in accordance with a second embodiment of the disclosure. Referring to FIGS. 3 and 6, the memory block BLKa is connected to a pass transistor unit PTa through word lines WLa. The word lines WLa may include the word lines WL1~WL6 described with reference to FIG. 3. The pass transistor unit PTa may include a plurality of pass transistors and the word lines WL1~WL6 may be connected to different pass transistors respectively. The string select lines SSL1a, SSL1b, SSL2a and SSL2b and the ground select lines GSL1a, GSL1b, GSL2a and GSL2b may also be connected to different pass transistors of the pass transistor unit PTa respectively.

The memory block BLKb is connected to a pass transistor unit PTb through word lines WLb. The word lines WLb may include the word lines WL1~WL6 described with reference to FIG. 3. The pass transistor unit PTb may include a plurality of pass transistors and the word lines WL1~WL6 may be connected to different pass transistors respectively. The string select lines SSL1a, SSL1b, SSL2a and SSL2b and the ground select lines GSL1a, GSL1b, GSL2a and GSL2b may also be connected to different pass transistors of the pass transistor unit PTb respectively.

The pass transistors of the pass transistor unit PTa and the pass transistor unit PTb may include high voltage transistors.

A source driver SDa is connected to the pass transistor unit PTa through source lines Sa. The source lines Sa may be connected to the word lines WL1~WL6, the string select lines SSL1a, SSL1b, SSL2a and SSL2b and the ground select lines GSL1a, GSL1b, GSL2a and GSL2b respectively of the memory block BLKa through the pass transistors of the pass transistor unit PTa. The source driver SDa can transmit voltages being supplied from a voltage generator VGNT to the source lines Sa in response to a row address RA.

A source driver SDb is connected to the pass transistor unit PTb through source lines Sb. The source lines Sb may be connected to the word lines WL1~WL6, the string select lines SSL1a, SSL1b, SSL2a and SSL2b and the ground select lines GSL1a, GSL1b, GSL2a and GSL2b respectively of the memory block BLKb through the pass transistors of the pass transistor unit PTb. The source driver SDb can transmit voltages being supplied from a voltage generator VGNT to the source lines Sb in response to a row address RA.

A block decoder BD is configured to control block pass transistors BPTa and BPTb in response to a block address BA. The block decoder BD is also configured to control a block word line BLKWL in response to the block address BA. The block word line BLKWL is connected to gates of the pass transistors of the pass transistor unit PTa through the block pass transistor BPTa. The block word line BLKWL is also connected to gates of the pass transistors of the pass transistor unit PTb through the block pass transistor BPTb. The memory blocks BLKa and BLKb can share the block word line BLKWL. The block pass transistors BPTa and BPTb may be a depletion type but is not limited to the depletion type. The block pass transistors BPTa and BPTb may be high voltage transistors.

A predecoder PD can extract the block address BA and the row address RA from the first address ADDR1.

The voltage generator VGNT can generate various voltages being used in the nonvolatile memory 110.

The memory blocks BLKa and BLKb may be included in the memory cell array 111. The pass transistor unit PTa, the pass transistor unit PTb, the source driver SDa, the source driver SDb, the block decoder BD, and the predecoder PD may be included in the address decoder 113. The voltage generator VGNT may be included in the control logic 119.

Figure 7:
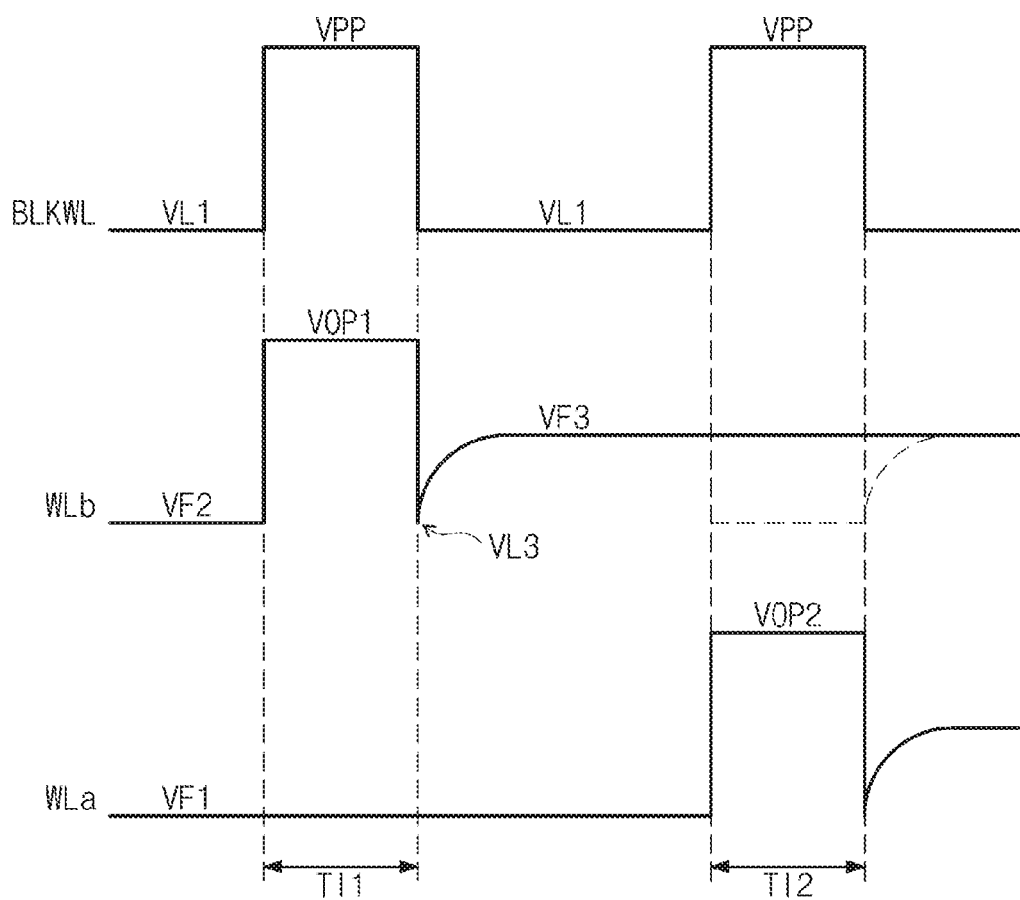
FIG. 7 is illustrates another example of an exchange of voltages of a nonvolatile memory when the nonvolatile memory accesses one of memory blocks.

When the nonvolatile memory 110 accesses one of the memory blocks BLKa and BLKb, an example of a change of voltages of the nonvolatile memory 110 is illustrated in FIG. 7. A change of voltages of the word lines WLa and WLb is illustrated in FIG. 7. However, a technical spirit of the disclosure is not limited to a change of voltages of the word lines WLa and WLb.

Referring to FIGS. 6 and 7, in a first period TI1, the nonvolatile memory 110 can access the memory block BLKb. For example, when the first address ADDR1 indicates the memory block BLKb and the first command CMD1 indicates a program, read or erase operation, the nonvolatile memory 110 can access the memory block BLKb.

During the first period TI1, the nonvolatile memory 110 can activate the block word line BLKWL corresponding to the memory block BLKb corresponding to the first address ADDR1. For example, the block decoder BD can apply a high voltage VPP to the block word line BLKWL. A voltage of the block word line BLKWL is changed from a low voltage VL1, for example, a ground voltage VSS to the high voltage VPP.

The block decoder BD can control the block pass transistors BPTa and BPTb of the memory blocks BLKa and BLKb sharing the block word line BLKWL so that the block pass transistor BPTb corresponding to the memory block BLKb selected by the first address ADDR1 is turned on and the block pass transistor BPTa corresponding to an unselected memory block BLKa is turned off.

As the block pass transistor BPTb is turned on, the high voltage VPP of the block word line BLKWL is transmitted to gates of the pass transistors of the pass transistor unit PTb. Thus, the pass transistors of the pass transistor unit PTb are turned on and the word lines WLb of the selected memory block BLKb are electrically connected to the source lines Sb.

As the block pass transistor BPTa is turned off, the high voltage VPP of the block word line BLKWL is not transmitted to the pass transistors of the pass transistor unit PTa. Thus, the word lines WLa of the unselected memory block BLKa sharing the selected memory block BLKb and the block word line BLKWL are floated. For example, even though the selected memory block BLKb is accessed, the unselected memory block BLKa can maintain a floating state, for example, floating voltages VF1.

The source driver SDb connected to the memory block BLKb selected by the first address ADDR1 can apply operating voltages VOP1 to the source lines Sb. The operating voltages VOP1 may include voltages being used in a program, read or erase operation. Voltages of the word line WLb of the selected memory block BLKb are changed from floating voltages VF2 to the operating voltage VOP1.

After an access of the selected memory block BLKb is completed, the source driver SDb reduces voltages of the source lines Sb, that is, voltages of the word lines WLb to a low voltage VL3. At this time, voltages of channels of the memory cells MC of the selected memory block BLKb may be reduced to negative potential. If the first period TI1 is finished, voltages of the word lines WLb of the selected memory block BLKb may increase to the floating voltages VF3 due to a coupling phenomenon.

During a second period TI2, the nonvolatile memory 110 can activate the block word line BLKWL corresponding to the memory block BLKa corresponding to the first address ADDR1. The block decoder BD can apply the high voltage VPP to the block word line BLKWL. The block decoder BD can turn on the block pass transistor BPTa corresponding to the selected memory block BLKa and turn off the block pass transistor BPTb corresponding to the unselected memory block BLKb.

The word lines WLa of the selected memory block BLKa is electrically connected to corresponding source lines Sa. The word lines WLb of the unselected memory block BLKb is electrically separated from corresponding source line Sb.

The source driver SDa corresponding to the selected memory block BLKa applies operating voltages VOP2 to the word lines WLa. While the operating voltages VOP2 are applied to the word lines WLa of the selected memory block BLKa, the word lines WLb of the unselected memory block BLKb sharing the block word line BLKWL with the selected memory block BLKa maintain a floating state, for example, a floating voltage VF3. Thus, the electric field described with reference to FIGS. 4 and 6 does not occur and reliability of data programmed in the memory cells MC is improved.

The operating voltages VOP1 or VOP2 may include a program voltage being applied to a selected word line and a pass voltage being applied to unselected word lines in a program operation. The operating voltages VOP1 or VOP2 may include a select read voltage being applied to a selected word line and an unselect read voltage being applied to unselected word lines in a read operation. The operating voltages VOP1 or VOP2 may include a word line erase voltage being applied to word lines in an erase operation. The operating voltages VOP1 or VOP2 may include a verification voltage being applied to a selected word line and a pass voltage being applied to unselected word lines in a program verification operation. The operating voltages VOP1 or VOP2 may include a verification voltage being applied to word lines in an erase verification operation.

In FIG. 6, the two memory blocks BLKa and BLKb share one block word line BLKWL. However, the number of memory blocks BLK sharing the block word line is not limited. For example, k (k is an integer which is two or more) number of memory blocks BLK may sharing one block word line BLKWL. At this time, the block decoder BD can control k number of block pass transistors BPT corresponding to k number of memory blocks BLK respectively. The block word line BLKWL may be connected to k number of block pass transistor units corresponding to k number of memory blocks BLK respectively through k number of block pass transistors BPT. The k number of block pass transistor units may be connected between k number of source drivers and k number of memory blocks BLK.

When the first address ADDR1 indicates one of the k number of memory blocks BLK, the block decoder BD can activate the block word line BLKWL. The block decoder BD can turn on block pass transistors BPT corresponding to the selected memory block BLK which the first address ADDR1 indicates and turn off block pass transistors BPT corresponding to the remaining unselected memory block BLK. That is, among memory blocks BLK sharing the block word line BLKWL, operating voltages OP are supplied to word lines WL of the selected memory block BLK and word lines WL of unselected memory blocks BLK may be floated.

In FIG. 6, it is illustrated that the block decoder BD controls both the block pass transistors BPTa and BPTb and the block word line BLKWL. However, the first part of the block decoder BD controlling the block pass transistors BPTa and BPTb and the second part of the block decoder BD controlling the block word line BLKWL may be detached. A block originated from the first part may control the block pass transistors BPTa and BPTb in response to the block address BA. A block originated from the second part may control the block word line BLKWL in response to the block address BA.

In FIG. 6, it is illustrated that the block decoder BD corresponding to the memory blocks BLKa and BLKb. However, the nonvolatile memory 110 may comprise two or more block decoders, each corresponding to two or more memory blocks. In an embodiment, the first parts of the two or more block decoders may form an integrated block which controls whole block pass transistors corresponding to the memory blocks BLK1 to BLKz. Memory blocks belong to the same block decoder may form a memory block group. The integrated block may control first block pass transistors of first memory blocks of different memory block groups in common. The integrated block may control second block pass transistors of second memory blocks of different memory block groups in common.

Figure 8:
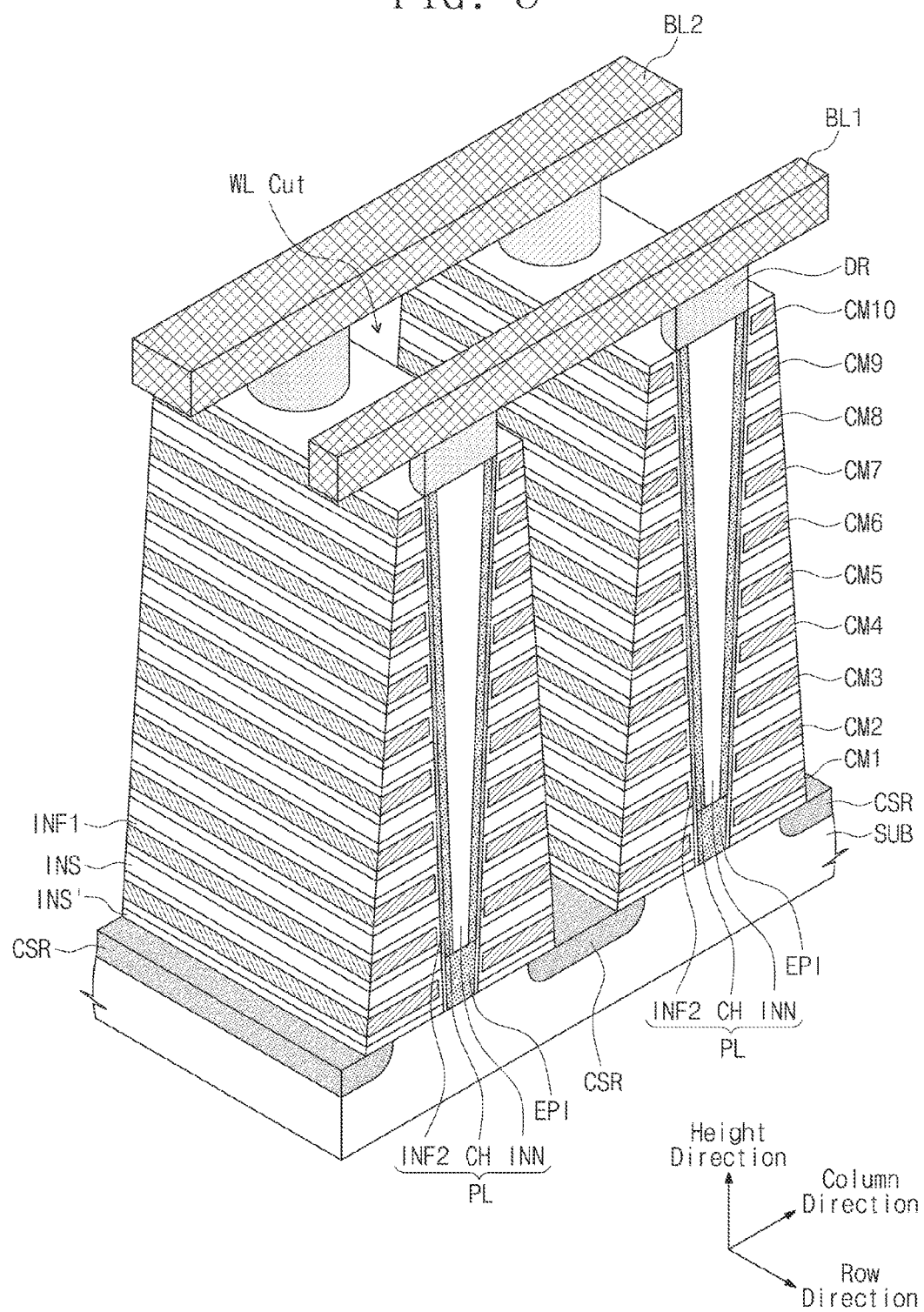
FIG. 8 is a perspective view illustrating an illustrative structure of the memory block of FIG. 3.

FIG. 8 is a perspective view illustrating an illustrative structure of the memory block of FIG. 3. Referring to FIGS. 3 and 8, common source regions CSR which extend along a row direction and are spaced apart from one another along a column direction are provided on a substrate SUB. The common source regions CSR may be connected to one another in common to constitute a common source line CSL. The substrate SUB may include semiconductor (for example, silicon) having a P conductivity type. The common source regions CSR may include semiconductor (for example, silicon) having an N conductivity type.

Between the common source regions CSR, a plurality of insulating layers INS and INS' is sequentially stacked on the substrate SUB along a height direction (for example, a direction perpendicular to substrate SUB). The insulating layers INS and INS' may be spaced apart from each other to be stacked along the height direction. The insulating layers INS and INS' may include an insulating material such as silicon oxide or silicon nitride. A thickness (a thickness along the height direction) of the insulating layer INS' in contact with the substrate SUB may be smaller than a thickness (a thickness along the height direction) of other insulating layers INS.

Between the common source regions CSR, a plurality of pillars PL are provided which are disposed to be spaced apart from one another along the row direction and the column direction and penetrate the insulating layers INS and INS' along the height direction. The pillars PL may contact a silicon layer EPI which penetrates the insulating layers INS and INS' to be provided on the substrate SUB. For example, the silicon layer EPI may be grown from the substrate SUB by a selective epitaxial growth. At a location of the pillar PL, the silicon layer EPI may protrude along a direction perpendicular to the substrate SUB from the substrate SUB. The silicon layer EPI may be an intrinsic or a P conductivity type.

Each pillar PL may include an insulating layer INF2, a channel layer CH and an internal material INN. The insulating layer INF2 may include at least two different insulating layers such as silicon oxide, silicon nitride, etc. The channel layer CH may include silicon having a P conductivity type or intrinsic silicon. The internal material INN may include an insulating material or an air gap.

Between the common source regions CSR, insulating layers INF1 are provided on top surfaces and bottom surfaces of the insulating layers INS and INS' and exposed external surfaces of the pillars PL. The insulating layers INF being provided on a top surface of an uppermost insulating layer among the insulating layers INS and INS' may be removed. The insulating layers INF may include at least one insulating layer such as silicon oxide, aluminum oxide, etc.

Between the common source regions CSR and between the insulating layers INS and INS', conductive materials CM1~CM10 are provided on exposed external surfaces of the information storage layers INF. The conductive materials CM1~CM10 may include a metallic conductive material.

A plurality of drains DR is provided on the pillars PL. The drains DR may include semiconductor (for example, silicon) having an N conductivity type. The drains DR may in contact with top surfaces of the channel layer CH of the pillars PL.

Bit lines BL1 and BL2 which extend along the column direction and are spaced apart from each other along the row direction are provided on the drains DR. The bit lines BL are connected to the drains DR. The drains DR and the bit lines BL1 and BL2 may be connected to one another through contact plugs. The bit lines BL1 and BL2 may include metallic conductive materials.

The pillars PL form a plurality of cell strings CS11, CS12, CS21 and CS22 together with the insulating layers INF1 and INF2 and the conductive materials CM1~CM10. Each pillar PL constitutes one cell string together with the insulating layers INF1 and INF2 and the adjacent conductive materials CM1~CM10.

The pillar PL and one conductive material CM corresponding thereto can form one cell transistor. For example, the conductive material CM may operate as a control gate. The insulating layers INF1 and INF2 located between the conductive material CM and the channel layer CH of the pillar PL may form an ONO (Oxide-Nitride-Oxide) structure or an ONOA (Oxide-Nitride-Oxide-Aluminum) structure. The insulating layer INF1 may form a blocking insulating layer. A silicon nitride layer of the insulating layer INF2 can form a charge capture layer. A silicon oxide layer of the insulating layer INF2 can form a tunneling insulating layer. That is, one conductive material CM and a pillar PL corresponding thereto can form a charge capture cell transistor.

The first and second conductive materials CM1 and CM2 may operate as control gates of the ground select transistors GSTa and GSTb respectively. The insulating layers INF1 and INF2 corresponding to the first and second conductive materials CM1 and CM2 can form charge capture layers of the ground select transistors GSTa and GSTb. The channel layers CH corresponding to the first and second conductive materials CM1 and CM2 can operate as a vertical body of the ground select transistors GSTa and GSTb.

The first conductive material CM1 of a first row can form a ground select line GSL1a. The second conductive material CM2 of the first row can form a ground select line GSL1b. The first conductive material CM1 of a second row can form a ground select line GSL2a. The second conductive material CM2 of the second row can form a ground select line GSL2b.

The third through eighth conductive materials CM3~CM8 can operate as control gates of the first through sixth memory cells MC1~MC6. The insulating layers INF1 and INF2 corresponding to the third through eighth conductive materials CM3~CM8 can operate as charge capture layers of the first through sixth memory cells MC1~MC6. The channel layers CH corresponding to the third through eighth conductive materials CM3~CM8 can operate as an active region of the first through sixth memory cells MC1~MC6, for example, a vertical body.

The third conductive materials CM3 can be connected in common to form a first word line WL1. The fourth conductive materials CM4 can be connected in common to form a second word line WL2. The fifth conductive materials CM5 can be connected in common to form a third word line WL3. The sixth conductive materials CM6 can be connected in common to form a fourth word line WL4. The seventh conductive materials CM7 can be connected in common to form a fifth word line WL5. The eighth conductive materials CM8 can be connected in common to form a sixth word line WL6.

The ninth and tenth conductive materials CM9 and CM10 can operate as control gates of the string select transistors SSTa and SSTb. The insulating layers INF1 and INF2 corresponding to the ninth and tenth conductive materials CM9 and CM10 can operate as charge capture layers of the string select transistors SSTa and SSTb. The channel layers CH corresponding to the ninth and tenth conductive materials CM9 and CM10 can operate as a vertical body of the string select transistors SSTa and SSTb.

The ninth conductive material CM9 of the first row can form the string select line SSL1a. The tenth conductive material CM10 of the first row can form the string select line SSL1b. The ninth conductive material CM9 of the second row can form the string select line SSL2a. The tenth conductive material CM10 of the second row can form the string select line SSL2b.

Figure 9:
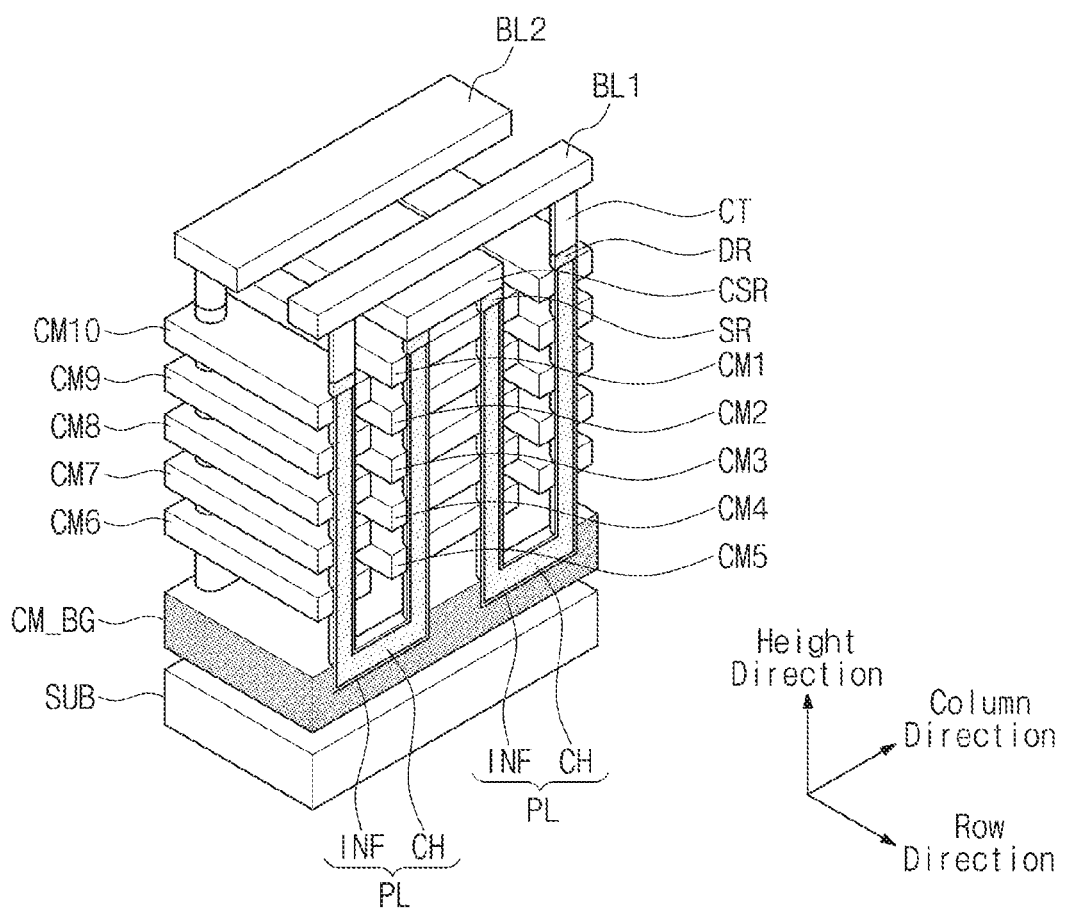
FIG. 9 is a perspective view illustrating another illustrative structure of the memory block of FIG. 3.

FIG. 9 is a perspective view illustrating another illustrative structure of the memory block of FIG. 3. Referring to FIGS. 3 and 9, a conductive material CM_BG of a plane shape extending along the row direction and the column direction is provided on a substrate SUB. The conductive material CM_BG may be electrically isolated from the substrate SUB.

On each row of the conductive material, conductive materials of first and second groups which extend along the row direction and are spaced apart from one another along the column direction are provided. The conductive materials of the first group include a plurality of conducive materials CM6~CM10 being stacked in a direction perpendicular to the substrate SUB on the substrate SUB. The conductive materials CM6~CM10 may be spaced apart from one another along a height direction. The conductive materials CM6~CM10 may be spaced apart from the conductive material CM_BG along the height direction.

The conductive materials of the second group include a plurality of conducive materials CM1~CM5 being stacked in a direction perpendicular to the substrate SUB on the substrate SUB. The conductive materials CM1~CM5 may be spaced apart from one another along the height direction. The conductive materials CM1~CM5 may be spaced apart from the conductive material CM_BG along the height direction.

On each row of the conductive material, pillars PL spaced apart from one another along the row direction are provided. Each pillar PL may penetrate the first through fifth conductive materials CM1~CM5 along the height direction perpendicular to the substrate SUB to extend to an inner space of the conductive material CM_BG. Each pillar PL may penetrate the sixth through tenth conductive materials CM6~CM10 along the height direction perpendicular to the substrate SUB to extend to an inner space of the conductive material CM_BG. Each pillar PL extends in the column direction in the inner space of the conductive material CM_BG to connect parts penetrating the conductive materials CM1~CM5 to parts penetrating the conductive materials CM6~CM10.

Each pillar PL includes an insulating layer INF and a channel layer CH. The insulating layer INF can form a charge capture layer. The insulating layer INF may include ONO or ONOA. The channel layer CH can form an active region.

In each pillar PL, parts penetrating the conductive materials CM1~CM5 may be connected to a common source region CSR through a source region SR along the height direction. The source region SR may include semiconductor having an N type conductivity, for example, silicon. The common source region CSR may include a metallic material or semiconductor.

In each pillar PL, parts penetrating the conductive materials CM6~CM10 may be connected to a bit line BL1 or BL2 through a drain region DR and a contact CT along the height direction. The drain region DR may include semiconductor having an N type conductivity, for example, silicon. The common source region CSR may include a metallic material or semiconductor.

As described with reference to FIG. 8, the common source region CSR can form a common source line CSL. The conductive materials CM1 and CM2 of the first row can form the ground select lines GSL1a and GSL1b respectively. The conductive materials CM1 and CM2 of the second row can form the ground select lines GSL2a and GSL2b respectively. The conductive materials CM3 can be connected in common to form a word line WL1. The conductive materials CM4 can be connected in common to form a word line WL2. The conductive materials CM5 can be connected in common to form a word line WL3. The conductive materials CM6 can be connected in common to form a word line WL4. The conductive materials CM7 can be connected in common to form a word line WL5. The conductive materials CM8 can be connected in common to form a word line WL6. The conductive materials CM9 and CM10 of the first row can form the string select lines SSL1a and SSL1b respectively and the conductive materials CM9 and CM10 of the second row can form the string select lines SSL2a and SSL2b respectively.

The conductive material CM_BG can form a back gate forming channels in parts of the pillar PL in parallel to the substrate SUB.

FIG. 10 is a block diagram illustrating a storage device 100 in accordance with exemplary embodiments of the disclosure. Referring to FIG. 10, the storage device 100 includes a nonvolatile memory 110, a memory controller 120 and a RAM 130.

The nonvolatile memory 110 can perform write, read and erase operations under the control of the memory controller 120. The nonvolatile memory 110 can exchange first data DATA1 with the memory controller 120. For example, the nonvolatile memory 110 can receive the first data DATA1 from the memory controller 120 and write the received first data DATA1. The nonvolatile memory 110 can perform a read operation and output the read first data DATA1 to the memory controller 120.

The nonvolatile memory 110 can receive a first command CMD1 and a first address ADDR1 from the memory controller 120. The nonvolatile memory 110 can exchange a control signal CTRL with the memory controller 120. For example, the nonvolatile memory 110 can receive at least one of a chip select signal /CE selecting at least one semiconductor chip among a plurality of semiconductor chips constituting the nonvolatile memory 110, a command latch enable signal CLE indicating that a signal being received from the memory controller 120 is the first command CMD1, an address latch enable signal ALE indicating that a signal being received from the memory controller 120 is the first address ADDR1, a read enable signal /RE which is generated by the memory controller 120 in a read operation and periodically toggled to be used to adjust the timing, a write enable signal /WE activated by the memory controller 120 when the first command CMD1 or the first address ADDR1 is transmitted, a write preventing signal/WP activated by the memory controller 120 to prevent an unwanted erase or an unwanted write when power supply is changed, and a data strobe signal DQS which is generated by the memory controller 120 in a write operation and is periodically toggled to be used to adjust an input sync of the first data DATA1 from the memory controller 120. For example, the nonvolatile memory 110 can output at least one of a ready & busy signal R/nB indicating whether the nonvolatile memory 110 performs a program, erase or read operation, and a data strobe signal DQS which is generated from the read enable signal /RE by the nonvolatile memory 110 and is periodically toggled to be used to adjust an output sync of the first data DATA1 to the memory controller 120.

The first data DATA1, the first address ADDR1 and the first command CMD1 can be communicated with the memory controller 120 through a first channel CH1. The first channel CH1 may be an input/output channel. The control signal CTRL can be communicated with the memory controller 120 through a second channel CH2. The second channel CH2 may be a control channel.

The nonvolatile memory 110 may include a flash memory. However, the nonvolatile memory 110 is not limited to include a flash memory. The nonvolatile memory 110 may include at least one of various nonvolatile memories such as a PRAM (phase-change RAM), an MRAM (magnetic RAM), an RRAM (resistive RAM), an FeRAM (ferroelectric RAM), etc.

The memory controller 120 is configured to control the nonvolatile memory 110. For example, the memory controller 120 can control so that the nonvolatile memory 110 performs a write, read or erase operation. The memory controller 120 can exchange the first data DATA1 and the control signal CTRL with the nonvolatile memory 110 and output the first command CMD1 and the first address ADDR1 to the nonvolatile memory 110.

The memory controller 120 can control the nonvolatile memory 110 under the control of an external host device (not shown). The memory controller 120 can exchange second data DATA 2 with the external host device and receive a second command CMD2 and a second address ADDR2 from the external host device.

The memory controller 120 can exchange the first data DATA1 with the nonvolatile memory 110 according to a first format and transmit the first command CMD1 and the first address ADDR1 to the nonvolatile memory 110. The memory controller 120 can exchange the second data DATA2 with the host device according to a second format different from the first format and receive the second command CMD2 and the second address ADDR2 from the host device.

The memory controller 120 can transmit a program request, a read request or an erase request to the nonvolatile memory 110. For example, a request may include at least two combinations among the first command CMD1, the first address ADDR1 and the first data DATA1. According to a request from the memory controller 120, the nonvolatile memory 110 can activate a block word line BLKWL corresponding to a memory block which the first address ADDR1 indicates. The nonvolatile memory 110, among memory blocks sharing the activated block word line BLKWL, can turn on a block pass transistor BPT of a memory block selected by the first address ADDR1. The nonvolatile memory 110, among memory blocks sharing the activated block word line BLKWL, can turn off a block pass transistor BPT of a memory block unselected by the first address ADDR1. That is, the nonvolatile memory 110, among memory blocks sharing the block word line BLKWL, can supply voltages to word lines of a selected memory block and float word lines of an unselected memory block.

The memory controller 120 can use the RAM 130 as a buffer memory, a cache memory or an operation memory. For example, the memory controller 120 can receive the second data DATA2 from the host device, store the received second data DATA2 in the RAM 130 and write the second data DATA2 stored in the RAM 130 in the nonvolatile memory 110 as the first data DATA1. The memory controller 120 can read the first data DATA1 from the nonvolatile memory 110, store the read first data DATA1 in the RAM 130 and output the first data DATA1 stored in the RAM 130 to the host device as the second data DATA2. The memory controller 120 can store data read from the nonvolatile memory 110 in the RAM 130 and write data stored in the RAM 130 in the nonvolatile memory 110 again.

The memory controller 120 can store data or a code necessary for managing the nonvolatile memory 110 in the RAM 130. For example, the memory controller 120 can read data or a code necessary for managing the nonvolatile memory 110 from the nonvolatile memory 110 and load it into the RAM 130 to drive it.

The memory controller 120 may include an ECC (error correction code) block 124. The ECC block 124 can generate a parity based on the first data DATA1 being written in the nonvolatile memory 110. The generated parity can be written in the nonvolatile memory 110 together with the first data DATA1. An operation of generating the parity may be an error correction encoding operation. The ECC block 124 can receive the first data DATA1 and the parity from the nonvolatile memory 110. The ECC block 124 can correct an error of the first data DATA1 using the received parity. An operation of correcting an error may be an error correction decoding operation.

The RAM 130 may include at least one of various random access memories such as a DRAM (dynamic RAM), an SRAM (static RAM), an SDRAM (synchronous DRAM), a PRAM (phase-change RAM), an MRAM (magnetic RAM), an RRAM (resistive RAM), an FeRAM (ferroelectric RAM), etc.

To reduce an overhead that an erase operation causes in the nonvolatile memory 110, the storage device 100 may perform an address mapping. For example, when an overwrite operation is requested from the external host device, the storage device 100 may store the overwrite-requested data in memory cells of a free storage space instead of erasing memory cells storing existing data to store the overwrite-requested data in the erased memory cells. The memory controller 120 can drive a FTL (flash translation layer) mapping a logical address being used in the external host device and a physical address being used in the nonvolatile memory 110 according to the method described above. For example, the second address ADDR2 may be a logical address and the first address ADDR1 may be a physical address.

The storage device 100 can perform a write, read or erase operation of data according to a request of the host device. The storage device 100 may include a SSD (solid state drive) or an HDD (hard disk drive). The storage device 100 may include memory cards such as a personal computer memory card international association (PCMCIA) card, a compact flash (CF) card, a smart media card (SM, SMC), a memory stick, a multimedia card (MMC, RS-MMC, MMCmicro), an SD card (SD, miniSD, microSD, SDHC), a universal flash memory device (UFS), etc. The storage device 100 may include a mounted memory such as an eMMC (embedded multimedia card), a UFS, a PPN (perfect page new), etc.

Figure 11:
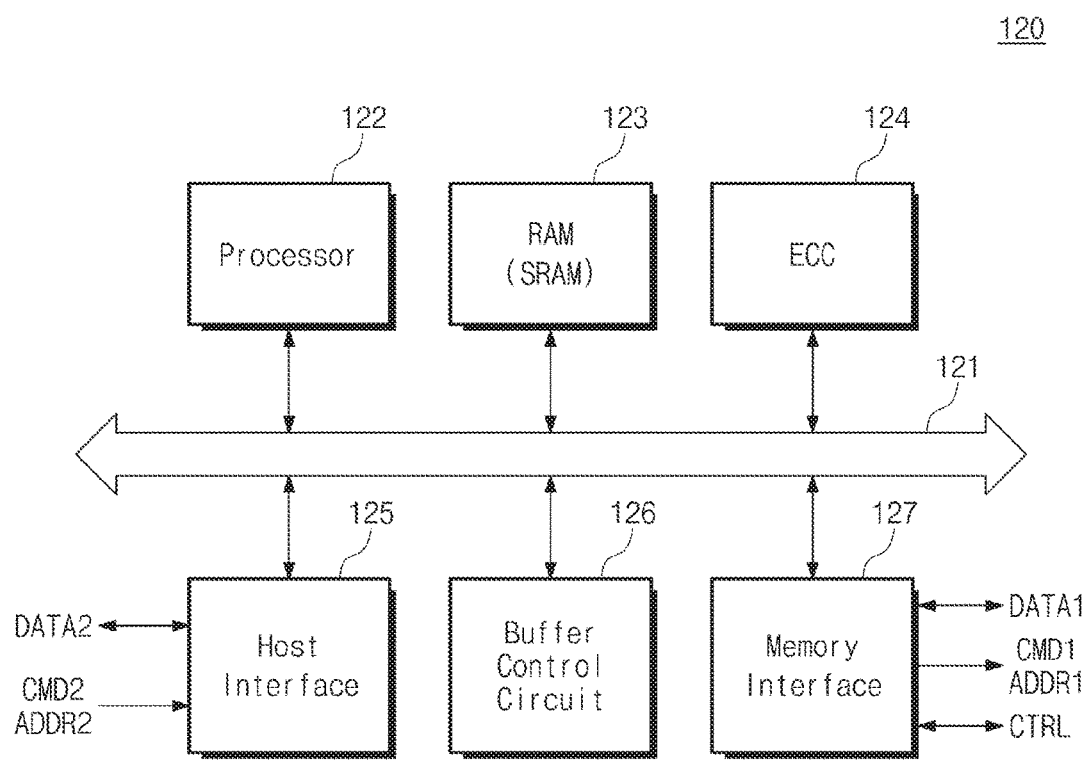
FIG. 11 is a block diagram illustrating a memory controller in accordance with exemplary embodiments of the disclosure.

FIG. 11 is a block diagram illustrating a memory controller 120 in accordance with exemplary embodiments of the disclosure. Referring to FIG. 11, the memory controller 120 includes a bus 121, a processor 122, a RAM 123, an ECC (error correction code) block 124, a host interface 125, a buffer control circuit 126 and a memory interface 127.

The bus 121 is configured to provide a channel among constituent elements of the memory controller 120.

The processor 122 can control an overall operation of the memory controller 120 and perform a logical operation. The processor 122 can communicate with an external host device through the host interface 125. The processor 122 can store the second command CMD2 and the second address ADDR2 being received through the host interface 125 in the RAM 123. The processor 122 can generate the first command CMD1 and the first address ADDR1 according to the second command CMD2 and the second address ADDR2 stored in the RAM 123 and output the generated first command CMD1 and the first address ADDR1 through the memory interface 127.

The processor 122 can output the second data DATA2 being received through the host interface 125 through the buffer control circuit 126 or store the second data DATA2 in the RAM 123. The processor 122 can output data stored in the RAM 123 or data being received through the buffer control circuit 126 through the memory interface 127 as the first data DATA1. The processor 122 can store the first data being received through the memory interface 127 in the RAM 123 or output the first data DATA1 through the buffer control circuit 126. The processor 122 can output data stored in the RAM 123 or data being received through the buffer control circuit 126 through the host interface 125 as the second data DATA2 or through the memory interface 127 as the first data DATA1.

The RAM 123 may be used as an operation memory, a cache memory or a buffer memory of the processor 122. The RAM 123 can store codes and commands being executed by the processor 122. The RAM 123 can store data being processed by the processor 122. The RAM 123 may include an SRAM (static RAM).

The ECC block 124 can perform an error correction operation. The ECC block 124 can generate an error correction code (for example, parity) for performing an error correction on the basis of the first data DATA1 to be output to the memory interface 127 or the second data DATA2 being received from the host interface 125. The first data DATA1 and the parity can be output through the memory interface 127. The ECC block 124 can perform an error correction of the received first data DATA1 using the first data DATA1 and the parity being received through the memory interface 127. The ECC block 124 may be included in the memory interface 127 as a constituent element of the memory interface 127.

The host interface 125 is configured to communicate with an external host device under the control of the processor 122. The host interface 125 can receive the second command CMD2 and the second address ADDR2 from the external host device and exchange the second data DATA2 with the external host device.

The host interface 125 may be configured to perform a communication using at least one of many different communication methods such as a universal serial bus (USB), a serial at attachment (SATA), a serial attachment SCSI (SAS), a high speed interchip (HSIC), a small computer small interface (SCSI), a Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), etc.

The buffer controller circuit 126 is configured to control the RAM 130 (refer to FIG. 1) under the control of the processor 122. The buffer control circuit 126 can write data in the RAM 130 and read data from the RAM 130.

The memory interface 127 is configured to communicate with the nonvolatile memory 110 (refer to FIG. 1) under the control of the processor 122. The memory interface 127 can transmit the first command CMD1 and the first address ADDR1 to the nonvolatile memory 110 and exchange the first data DATA1 and the control signal CTRL with the nonvolatile memory 110.

The RAM 130 may not be provided to the storage device 100. That is, the storage device 100 may not have a separate memory outside the memory controller 120 and the nonvolatile memory 110. At this time, the buffer control circuit 126 may not be provided to the memory controller 120. A function of the RAM 130 may be performed by the internal RAM 123 of the memory controller 120.

As an illustration, the processor 122 can control the memory controller 120 using codes. The processor 122 can load codes from nonvolatile memory (for example, read only memory) being provided inside the memory controller 120. As another illustration, the processor 122 can load codes being received from the memory interface 127.

The bus 121 of the memory controller 120 may be divided into a control bus and a data bus. The data bus may be configured to transmit data in the memory controller 120 and the control bus may be configured to transmit control information such as a command, an address, etc. in the memory controller 120. The data bus and the control bus may be separated from each other and may not interfere or affect each other. The data bus may be connected to the host interface 125, the buffer control circuit 126, the ECC (error correction code) block 124 and the memory interface 127. The control bus may be connected to the host interface 125, the processor 122, the buffer control circuit 126, RAM 123 and the memory interface 127.

According to exemplary embodiments of the disclosure, word lines of an unselected memory block among memory blocks sharing a block word line are floated. Thus, data stored in memory cells is prevented from being lost by voltages of word lines of an unselected memory block, and a nonvolatile memory and a storage device that have improved reliability are provided.

Figure 12:
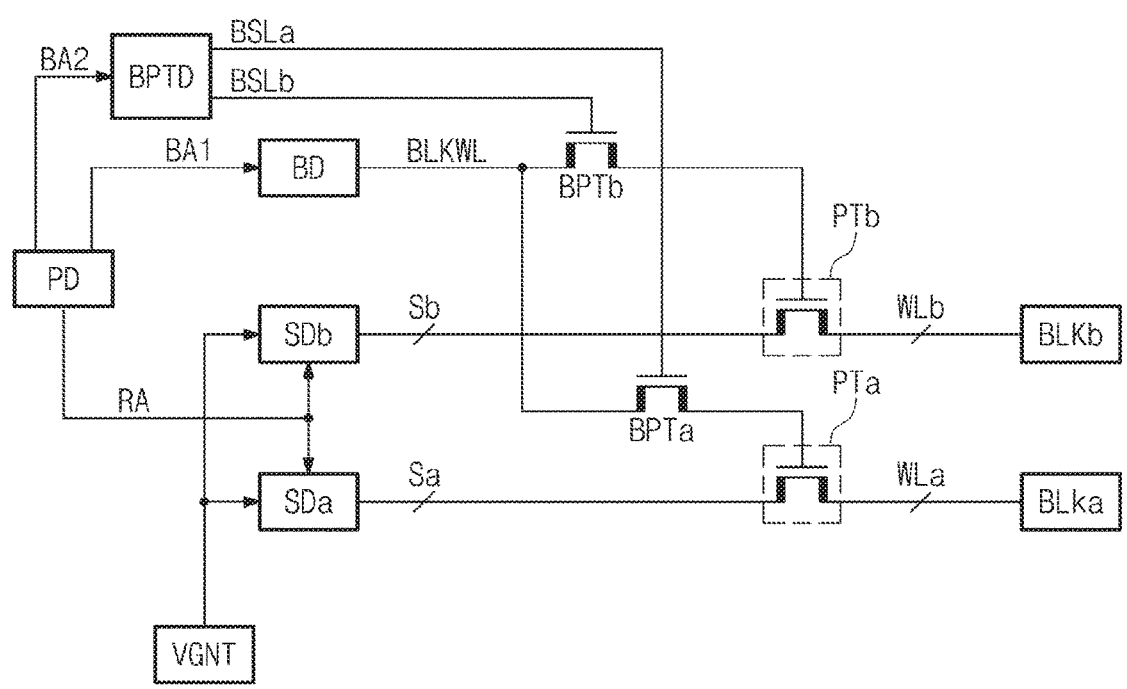
FIG. 12 is a block diagram illustrating memory blocks and peripheral circuits in accordance with a third embodiment of the disclosure.

FIG. 12 is a block diagram illustrating memory blocks and peripheral circuits in accordance with a third embodiment of the disclosure. Referring to FIGS. 3 and 12, memory blocks BLKa and BLKb, pass transistors PTa and PTb, block pass transistors BPTa and BPTb, a block decoder BD, source drivers SDa and SDb, a predecoder PD, a voltage generator VGNT, and a block pass transistor decoder BPTD are shown similarly to FIG. 12.

Comparing with FIG. 6, the block pass transistor decoder BPTD is further provided. The block decoder BD may control a voltage of the block word line BLKWL in response to the block address BA. When the block address BA indicates a memory block BLKa of BLKb belong to the corresponding memory block group, the block decoder BD may increase the voltage of the block word line BLKWL to a turn-on voltage of the pass trnasistors PTa or PTb.

The block pass transistor decoder BPTD may control block select lines BSLa and BSLb connected to gates of the block pass transistors BPTa and BPTb in response to the block address BA. When the block address BA indicates the memory block BLKa, the block pass transistor decoder BPTD may increase a voltage of the block select line BSLa to a turn-on voltage of the block pass transistor BPTa. Thus, the voltage of the block word line BLKWL may transmitted to gates of the pass transistors PTa. Furthermore, the block pass transistor decoder BPTD may control a voltage of the block select line BSLb to a turn-off voltage of the block pass transistor BPTb, and gates of the pass transistors PTb may be floated.

When the block address BA indicates the memory block BLKb, the block pass transistor decoder BPTD may increase a voltage of the block select line BSLb to a turn-on voltage of the block pass transistor BPTb. Thus, the voltage of the block word line BLKWL may transmitted to gates of the pass transistors PTb. Furthermore, the block pass transistor decoder BPTD may control a voltage of the block select line BSLa to a turn-off voltage of the block pass transistor BPTa, and gates of the pass transistors PTa may be floated.

Figure 13:
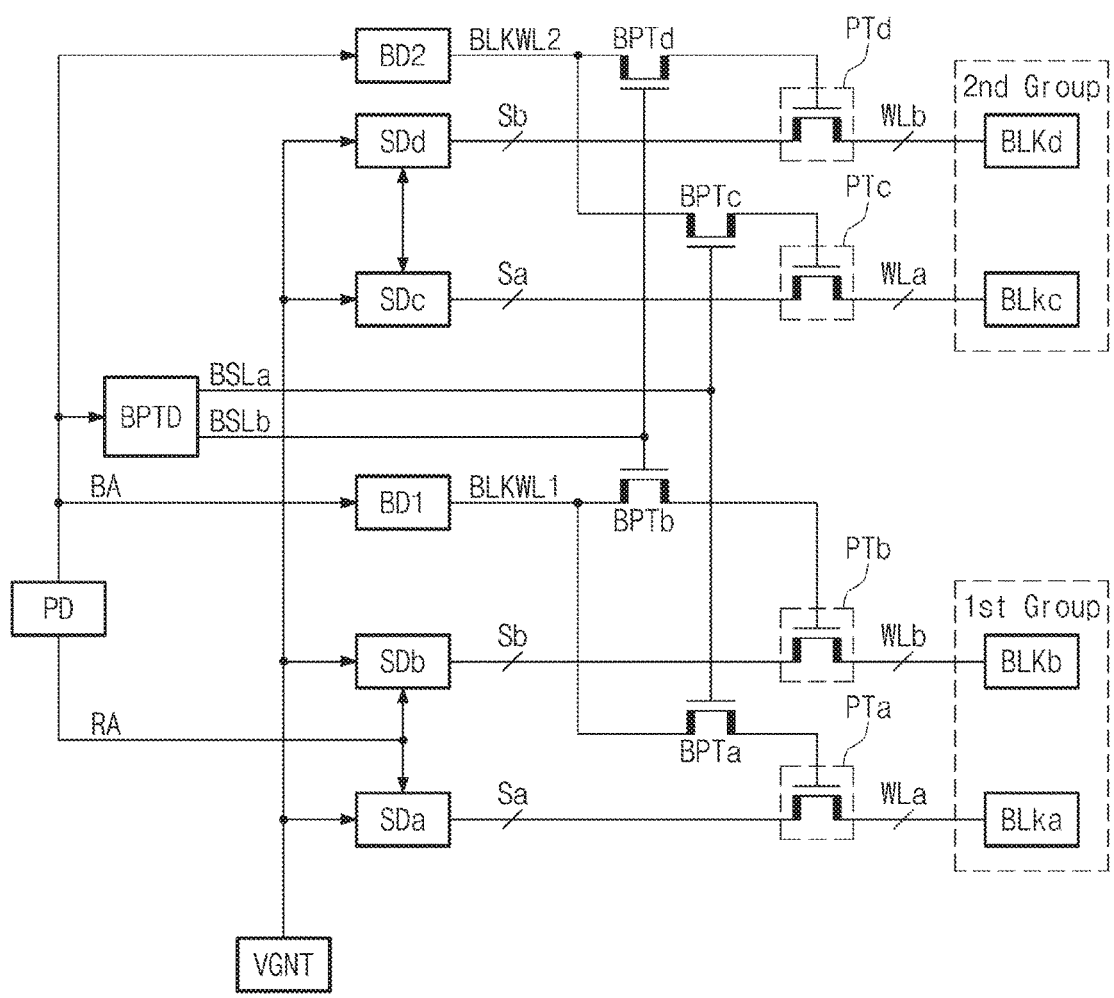
FIG. 13 is a block diagram illustrating memory blocks and peripheral circuits in accordance with a fourth embodiment of the disclosure.

FIG. 13 is a block diagram illustrating memory blocks and peripheral circuits in accordance with a fourth embodiment of the disclosure. Referring to FIGS. 3 and 13, memory blocks BLKa through BLKd, pass transistors PTa through PTd, block pass transistors BPTa through BPTd, block decoders BD1 and BD2, source drivers SDa through SDd, a predecoder PD, a voltage generator VGNT, and a block pass transistor decoder BPTD are shown similarly to FIG. 13.

The memory blocks BLKa and BLKb may form a first memory block group. The memory blocks BLKc and BLKd may form a second memory block group. The pass transistors PTa and PTb may correspond to the memory blocks BLKa and BLKb belong to the first memory block group. The pass transistors PTc and PTd may correspond to the memory blocks BLKc and BLKd belong to the second memory block group.

The block pass transistors BPTa and BPTb may correspond to the memory blocks BLKa and BLKb belong to the first memory block group. The block pass transistors BPTc and BPTd may correspond to the memory blocks BLKc and BLKd belong to the second memory block group. The source drivers SDa and SDb may correspond to the memory blocks BLKa and BLKb belong to the first memory block group. The source drivers SDc and SDd may correspond to the memory blocks BLKc and BLKd belong to the second memory block group. The source drivers SDa through SDd may transmit voltages from the voltage generator VGNT to the pass transistors PTa through PTd respectively.

The source drivers SDa through SDd may control voltages transmitted to the pass transistors PTa through PTd in response to the row address RA. For example, the source drivers SDa through SDd may select a source line to which a select line voltage is applied. The source drivers SDa through SDd may select source lines to which unselect line voltages are applied.

The block decoder BD1 may correspond to the first memory block group. The block decoder BD1 may control a voltage of the block word line BLKWL1 connected to the block pass transistors BPTa and BPTb in common in response to the block address BA. The block decoder BD2 may correspond to the second memory block group. The block decoder BD2 may control a voltage of the block word line BLKWL2 connected to the block pass transistors BPTc and BPTd in common in response to the block address BA.

The block pass transistor decoder BPTD may corresponds to the whole memory blocks BLKa through BLKd. The blck pass transistor decoder BPTD may control whole block pass transistors BPTa through BPTb in response to the block address BA. In an embodiment, the block pass transistor decoder BPTD may control block pass transistors of each memory block group identically. The block pass transistor decoder BPTD may control voltages of the block select lines BSLa and BSLb. The block select line BSLa may be connected to gates of first block pass transistors (e.g., BPTa and BPTc) of the first and second memory block groups in common. The block select line BSLb may be connected to gates of second block pass transistors (e.g., BPTb and BPTd) of the first and second memory block groups in common.

The predecoder PD may extract the block address BA and the row address RA from an address received from an external device (e.g., the memory controller 120). The predecoder PD may output the block address BA to the block pass transistor decoder BPTD and the block decoders BD1 and BD2. The predecoder PD may output the row address RA to the source drivers SDa through SDd.

As described above, the memory blocks of the memory cell array 111 may be divided into a plurality of memory block groups. Each memory block group may include at least two memory blocks. A block decoder is provided for each memory block group. The block decoder may control voltages of block word lines of the memory blocks belong the same memory block group. A block pass transistor decoder is provided for the memory cell array 111. The block pass transistor decoder may control whole block pass transistors of the memory cell array 111. The block pass transistor decoder may control voltages of block select lines of each memory block group identically. The block pass transistor decoder may control voltages of the first block select lines of different memory block groups in common and control voltages of the second block select lines of the different memory block groups in common.

The foregoing is illustrative of the disclosure and is not to be construed as limiting thereof. Although a few embodiments of the disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. The present disclosure is defined by the following claims, with equivalents of the claims to be included therein.

What is claimed is:

1. A nonvolatile memory comprising:
    a plurality of memory blocks, the plurality of memory blocks being divided into a plurality of memory block groups, each memory block group including at least two memory blocks;
    a plurality of source drivers corresponding to the plurality of memory blocks;
    a plurality of pass transistor groups connected between the plurality of source drivers and the plurality of memory blocks, each pass transistor group including a plurality of pass transistors;
    a plurality of block pass transistors connected between a plurality of block word lines and the plurality of pass transistor groups;
    a plurality of block decoders corresponding to the plurality of memory block groups respectively, each block decoder being configured to control first voltages of block word lines, among the plurality of block word lines, connected to the at least two memory blocks of a corresponding memory block group in common; and
    a block pass transistor decoder configured to control second voltages of block select lines connected to the plurality of block pass transistors.

2. The nonvolatile memory of claim 1, wherein the block pass transistor decoder is configured to control third voltages of first block select lines corresponding to the plurality of memory block groups in common and control fourth voltages of second block select lines corresponding to the plurality of memory block groups in common.

3. The nonvolatile memory of claim 1, wherein each block decoder is configured to control the first voltages of the block word line to first turn-on voltages of the plurality of pass transistors in common when a memory block belong to the corresponding memory block group is selected.

4. The nonvolatile memory of claim 3, wherein the block pass transistor decoder is configured to control third voltages of first block select lines corresponding to the plurality of memory block groups to second turn-on voltages of the block pass transistors in common and control fourth voltages of second block select lines corresponding to the plurality of memory block groups to turn-off voltages of the block pass transistors in common,
    wherein a block select line among the first block select lines corresponds to the memory block selected.

5. The nonvolatile memory of claim 4, wherein a source driver among the plurality source drivers is configured to apply fifth voltages to word lines of the memory block selected through a corresponding pass transistor group of which pass transistors are turned on by a first turn-on voltage, among the first turn-on voltages, transmitted through a corresponding block pass transistor turned on by a second turn-on voltage among the second turn-on voltages.

6. The nonvolatile memory of claim 1, wherein first word lines of a first memory block are supplied with third voltages by turning-on corresponding first pass transistors and second word lines of a second memory block are floated by turning-off corresponding second pass transistors when the first memory block is selected,
    wherein the first memory block and the second memory block belong to a same memory block group.

7. The nonvolatile memory of claim 6, wherein the first pass transistors are turned on by turning on a corresponding first block pass transistor and the second pass transistors are turned off by turning off a corresponding second block pass transistor.

8. The nonvolatile memory of claim 6, wherein after accessing the first memory block, the third voltages decrease and then the corresponding first pass transistors are turned off, and
    wherein after corresponding first pass transistors are turned off, fourth voltages of the first word lines increase.

9. The nonvolatile memory of claim 1, further comprising:
    a voltage generator configured to generate third voltages and supply the third voltages to the plurality of source drivers in common.

10. The nonvolatile memory of claim 9, further comprising:
    a predecoder configured to extract a row address from an address received from an external device and transfer the row address to the plurality of source drivers in common.

11. The nonvolatile memory of claim 10, wherein the plurality of source drivers are configured to transmit the fourth voltages to the plurality of pass transistor groups in response to the row address.

12. The nonvolatile memory of claim 1, further comprising:
a predecoder configured to extract a block address from an address received from an external device and transfer the row address to the plurality of block decoders and the block pass transistor decoder,
wherein each block decoder controls the first voltages in response to the block address and the block pass transistor decoder controls the second voltages in response to the block address.

13. A storage device comprising:
a memory controller configured to output an command and an address; and
a nonvolatile memory comprising first through fourth memory blocks and configured to access one of the first through fourth memory blocks in response to the command and the address,
wherein the nonvolatile memory further comprises:
a first block decoder configured to output first voltage to first and second block word lines corresponding to the first and second memory blocks;
a second block decoder configured to output second voltage to third and fourth block word lines corresponding to the third and fourth memory blocks;
a block pass transistor decoder configured to output third voltage to first and third block select lines corresponding to the first and third memory blocks and output fourth voltage to second and fourth block select lines corresponding to the second and fourth memory blocks;
first through fourth pass transistor groups configured to transmit word line voltages to one of the first through fourth memory blocks in response to gate voltages; and
first through fourth block pass transistors configured to transmit the first and second voltages to either the first and third pass transistor groups or the second and fourth pass transistor groups as the gate voltages in response to the third and fourth voltages.

14. The nonvolatile memory of claim 13, wherein the first and third block pass transistors and the first pass transistor group are turned on when the first memory block is selected.

15. A nonvolatile memory comprising:
first through fourth memory blocks;
a first block decoder configured to output first voltage to first and second block word lines corresponding to the first and second memory blocks;
a second block decoder configured to output second voltage to third and fourth block word lines corresponding to the third and fourth memory blocks;
first through fourth pass transistor groups configured to transmit word line voltages to one of the first through fourth memory blocks in response to gate voltages; and
first through fourth block pass transistors connected between gates of the first through fourth pass transistor groups and the first and second block decoders.

16. The nonvolatile memory of claim 15, further comprising:
a block pass transistor decoder configured to output a third voltage to the first and third block pass transistors and output a fourth voltage to the second and fourth block pass transistors.

17. The nonvolatile memory of claim 15, further comprising:
a first through fourth source derivers connected to the first through fourth pass transistor groups to output the word line voltages; and
a voltage generator configured to generate word line voltages and transmit the word line voltages to the first through fourth source drivers.

18. The nonvolatile memory of claim 17, further comprising:
a predecoder configured to extract a block address and a row address from an address received from an external device, transmit the block address to the first and second block decoders, and transmit the row address to the first through fourth source drivers.

19. The nonvolatile memory device of claim 18, one of the first and second block decoders controls one of the first and second voltages to a turn-on voltage of the first through fourth pass transistor groups in response to the block address.

20. The nonvolatile memory device of claim 18, the first through fourth source drivers control the word line voltages in response to the row address.

* * * * *